US012787267B2

(12) United States Patent
Munetaka et al.

(10) Patent No.: US 12,787,267 B2
(45) Date of Patent: Nov. 3, 2026

(54) SEMICONDUCTOR DEVICE AND METHOD OF FORMING THE SAME

(71) Applicant: MICRON TECHNOLOGY, INC., Boise, ID (US)

(72) Inventors: Yuki Munetaka, Higashihiroshima (JP); Tsuyoshi Tomoyama, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 528 days.

(21) Appl. No.: 17/740,064

(22) Filed: May 9, 2022

(65) Prior Publication Data

US 2023/0363148 A1 Nov. 9, 2023

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02); *H10B 12/34* (2023.02)

(58) Field of Classification Search
CPC ...... H10B 12/50; H10B 12/34; H10B 12/315; H10B 12/09; H10B 12/488; G11C 11/408; G11C 11/407; G11C 11/409
See application file for complete search history.

(56) References Cited

U.S. PATENT DOCUMENTS

| | | | | |
|---|---|---|---|---|
| 8,743,580 | B2 * | 6/2014 | Liaw | H10D 30/62 365/185.05 |
| 2008/0158964 | A1 * | 7/2008 | Ishibashi | G11C 5/025 365/185.13 |
| 2009/0040824 | A1 * | 2/2009 | Iizuka | H10B 69/00 365/210.1 |
| 2014/0377934 | A1 * | 12/2014 | Takesako | H10B 12/09 438/675 |
| 2016/0233297 | A1 * | 8/2016 | Tomoyama | H01L 21/762 |
| 2022/0051698 | A1 * | 2/2022 | Han | H01L 23/5386 |
| 2022/0189967 | A1 * | 6/2022 | Kim | H10B 12/482 |

* cited by examiner

*Primary Examiner* — Shaun M Campbell
(74) *Attorney, Agent, or Firm* — Dorsey & Whitney LLP

(57) ABSTRACT

An apparatus includes a plurality of memory cells in a memory cell array region; a plurality of word lines extending across the memory cell array region and a peripheral region in which no memory cell is arranged; a plurality of contact plugs on even numbered ones of the plurality of word lines in the peripheral region, respectively; and a plurality of insulating walls on odd numbered ones of the plurality of word lines in the peripheral region, respectively.

14 Claims, 30 Drawing Sheets

SEMICONDUCTOR DEVICE AND METHOD OF FORMING THE SAME

BACKGROUND

Semiconductor devices, for example, dynamic random access memories (hereinafter referred to as DRAM) are being promoted to be further miniaturized in order to increase data storage capacities thereof. For example, the size of the repeating pitch of wirings such as word lines, etc. of DRAM is reduced, and the distance between word lines is also reduced. However, when the diameters of contact holes to be connected to the word lines are increased during formation of the contact holes, adjacent word lines may be short-circuited.

Figure 3A:
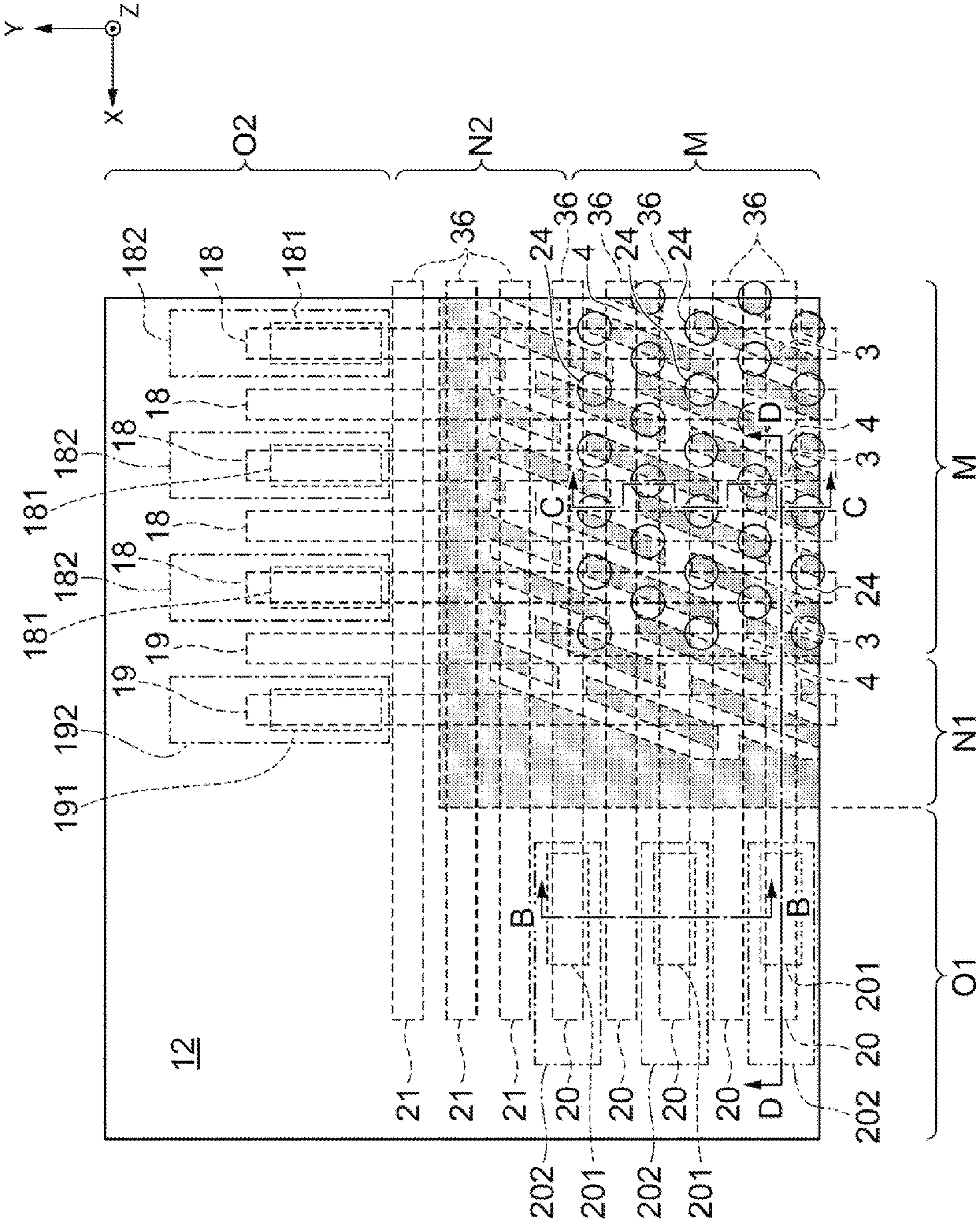
FIG. 3A is a planar layout diagram showing a schematic configuration of the memory cell array region of the semiconductor device according to the embodiment, and is an enlarged view of an edge region A1 of FIG. 1B.
Figure 3B:
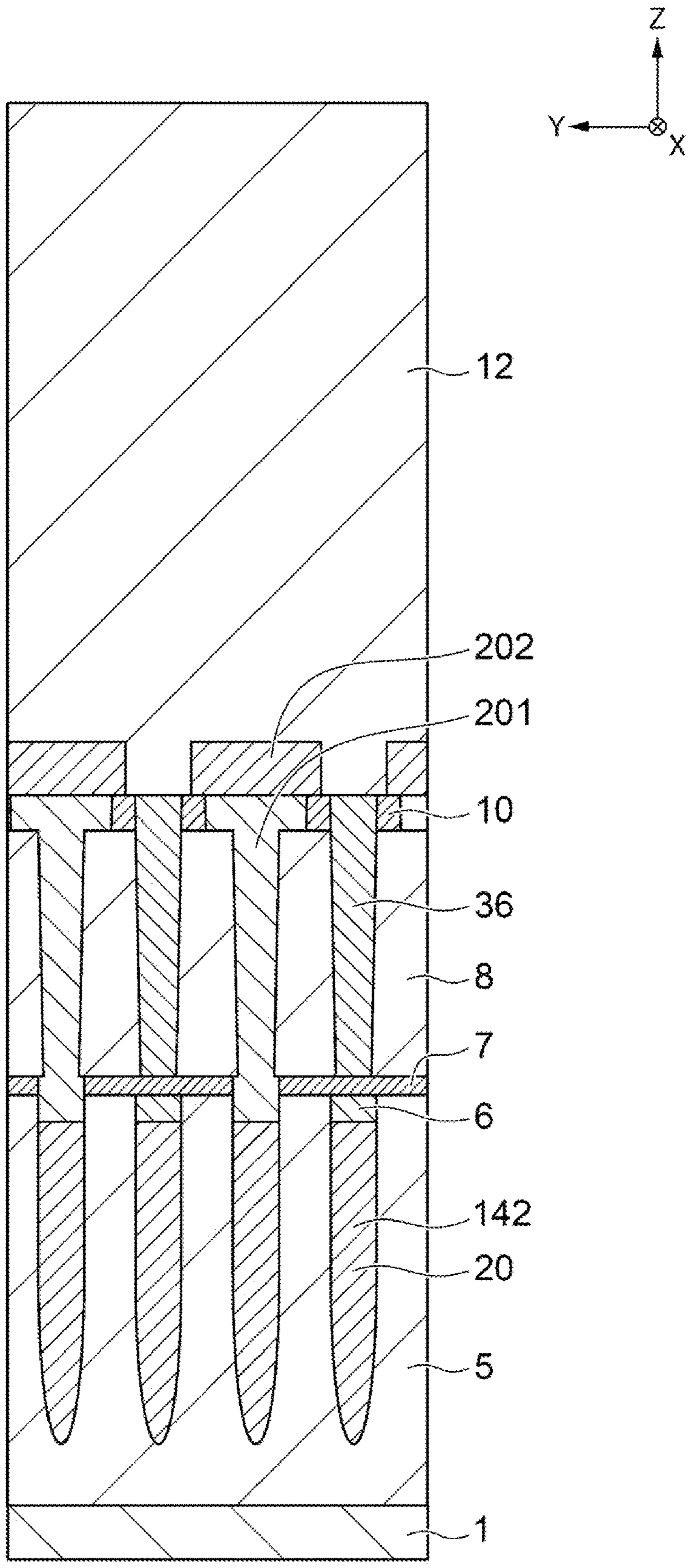
FIGS. 3B and 3C are diagrams showing schematic configurations of the semiconductor device according to the embodiment, and are vertical cross-sectional views showing schematic configurations of portions taken along a line B-B and a line C-C of FIG. 3A respectively.
Figure 3C:
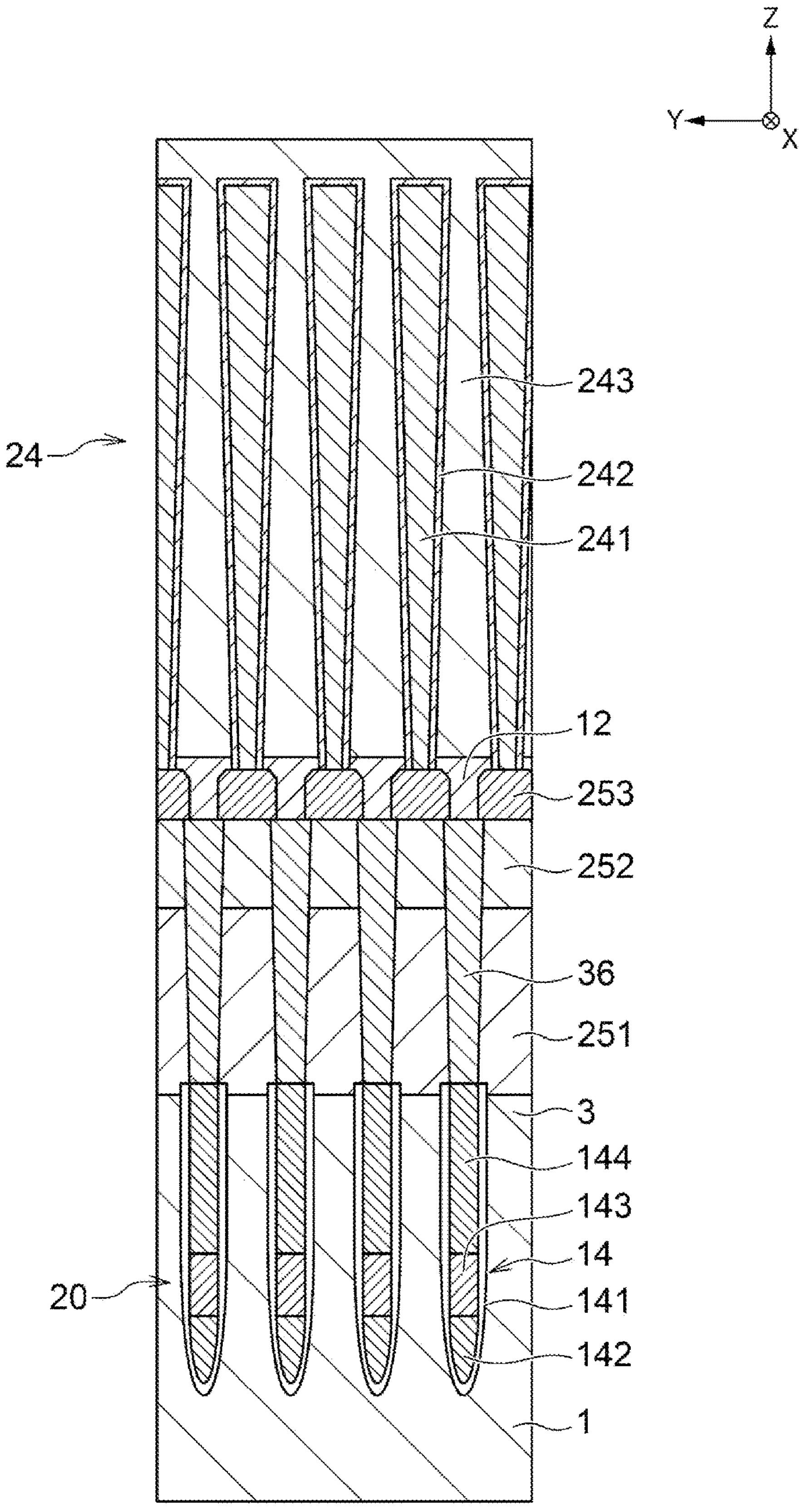
Figure 3D:
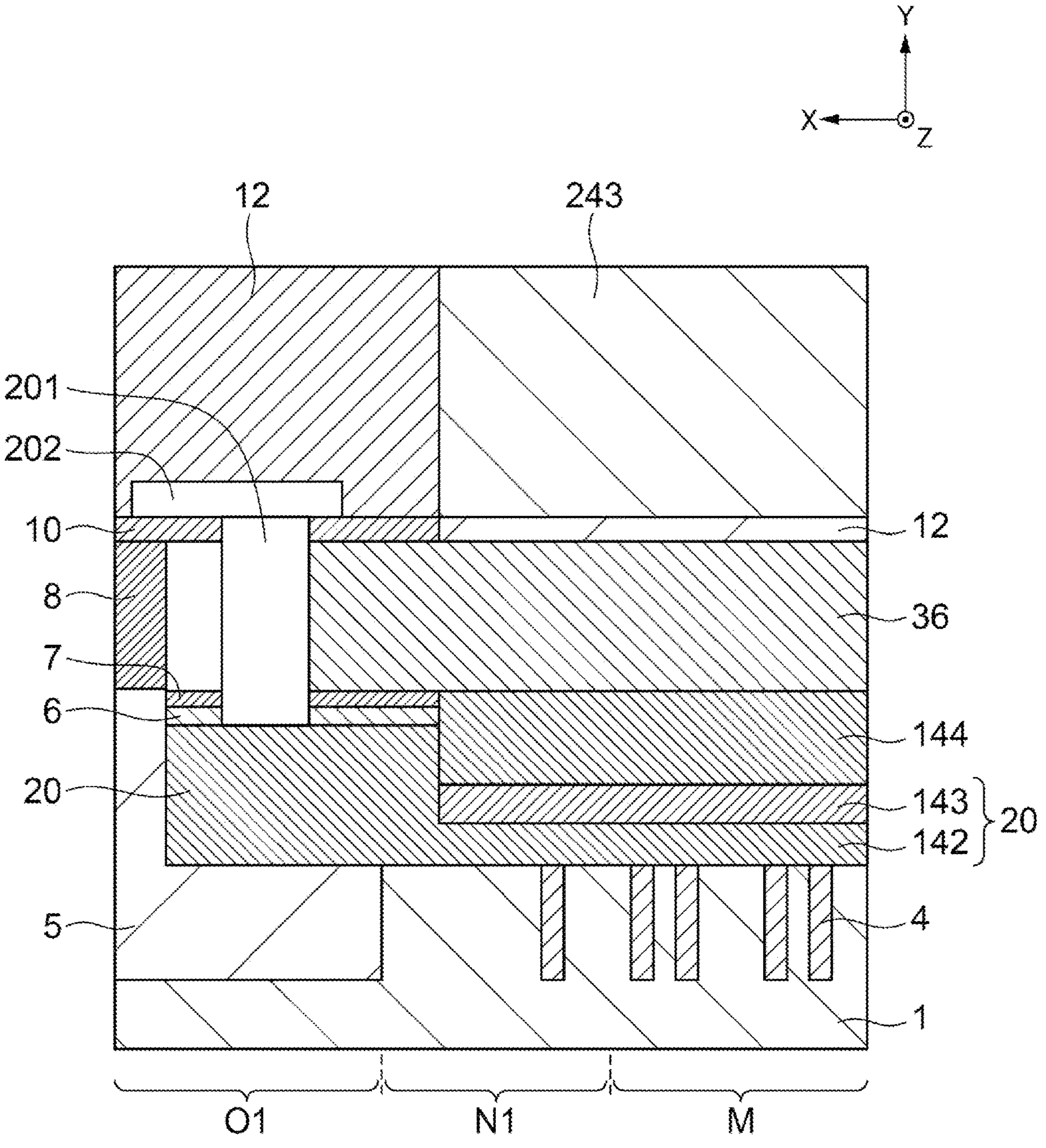
Figure 4A:
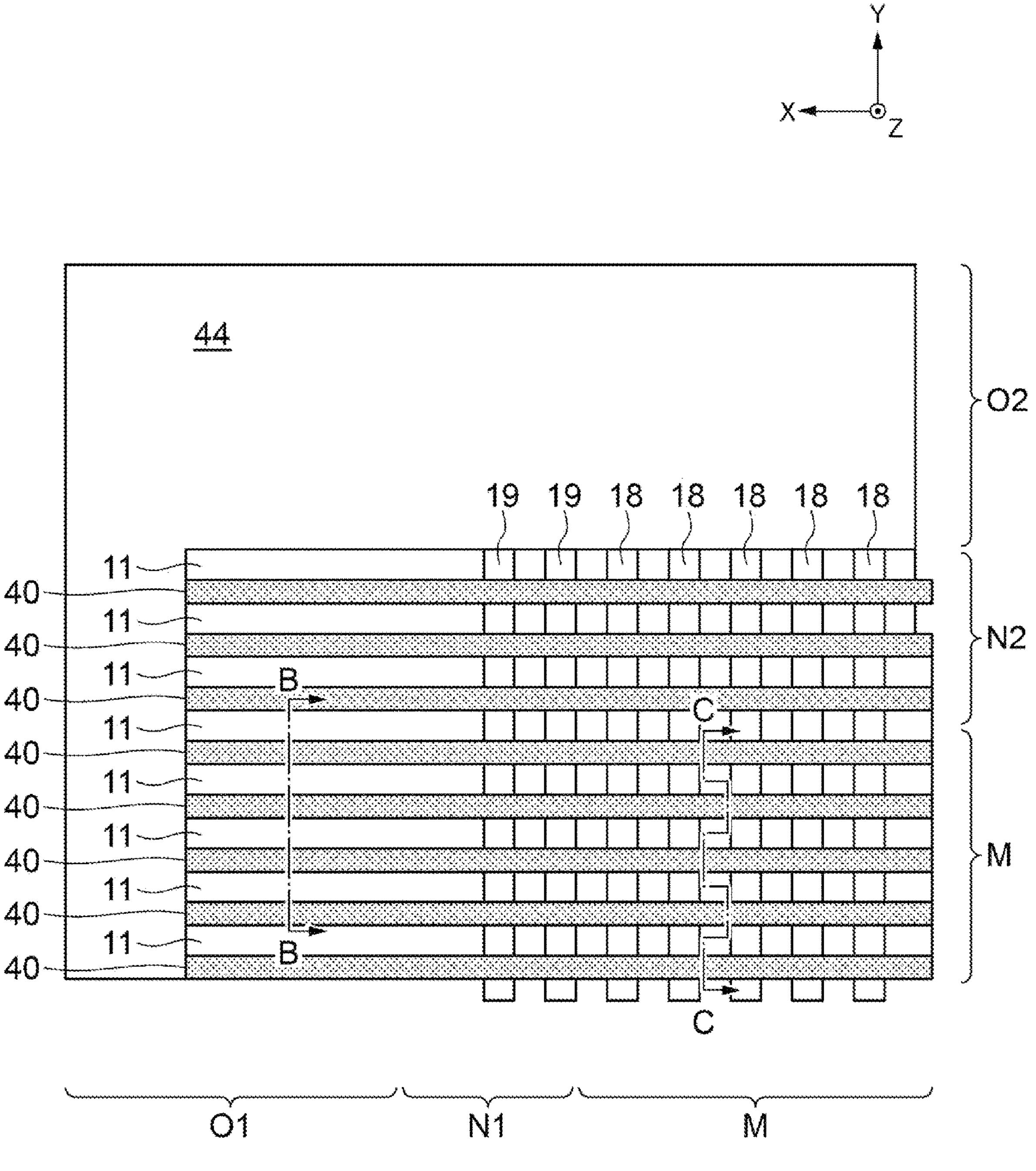
Figure 4B:
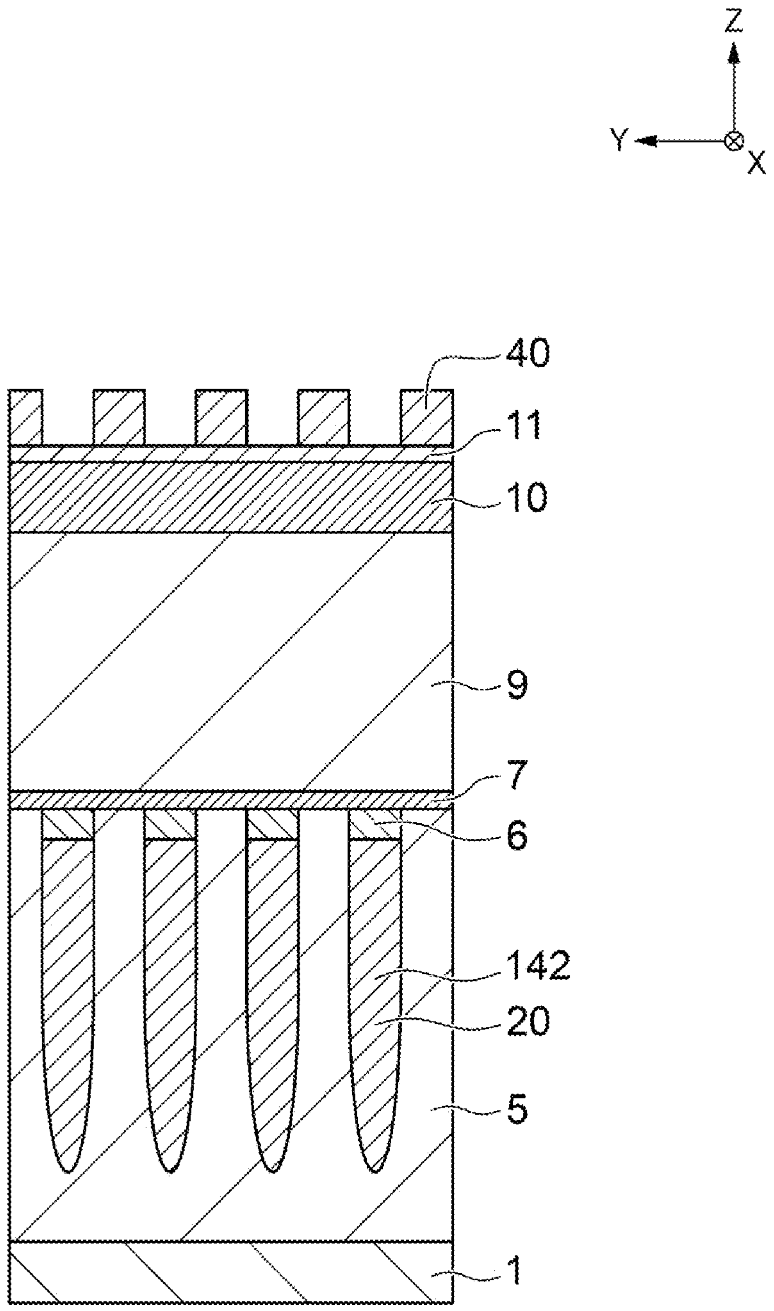
Figure 4C:
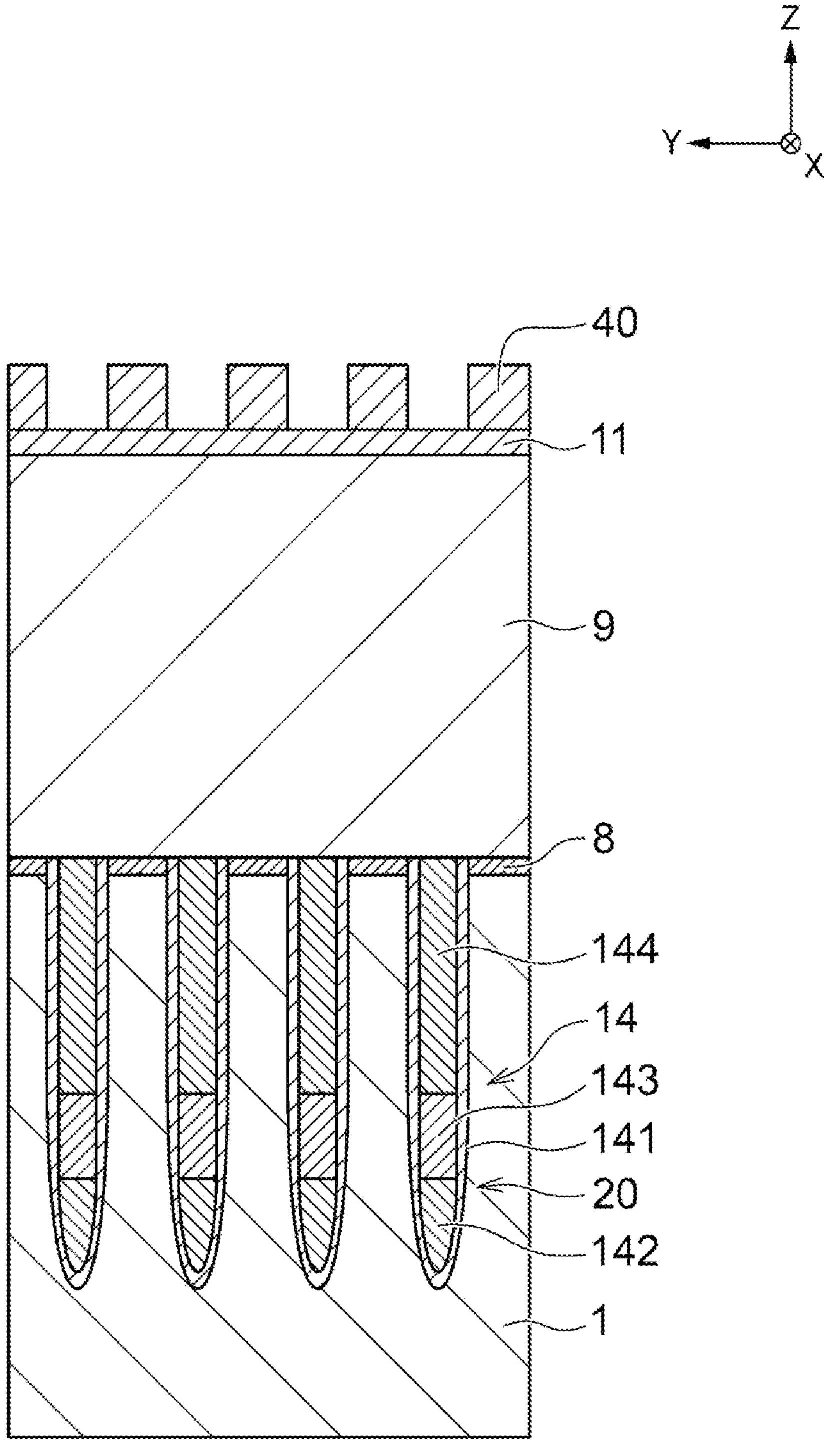
Figure 5A:
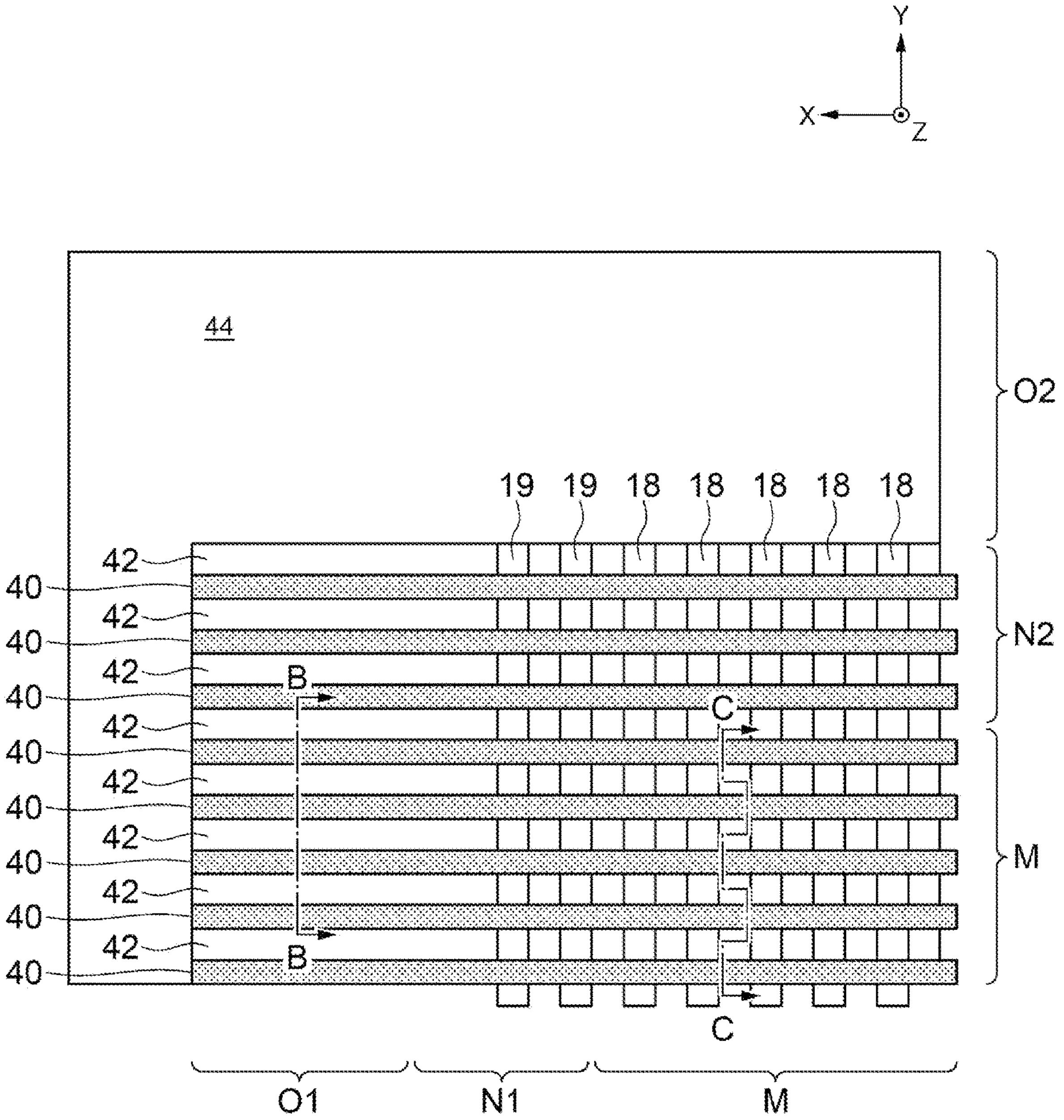
Figure 5B:
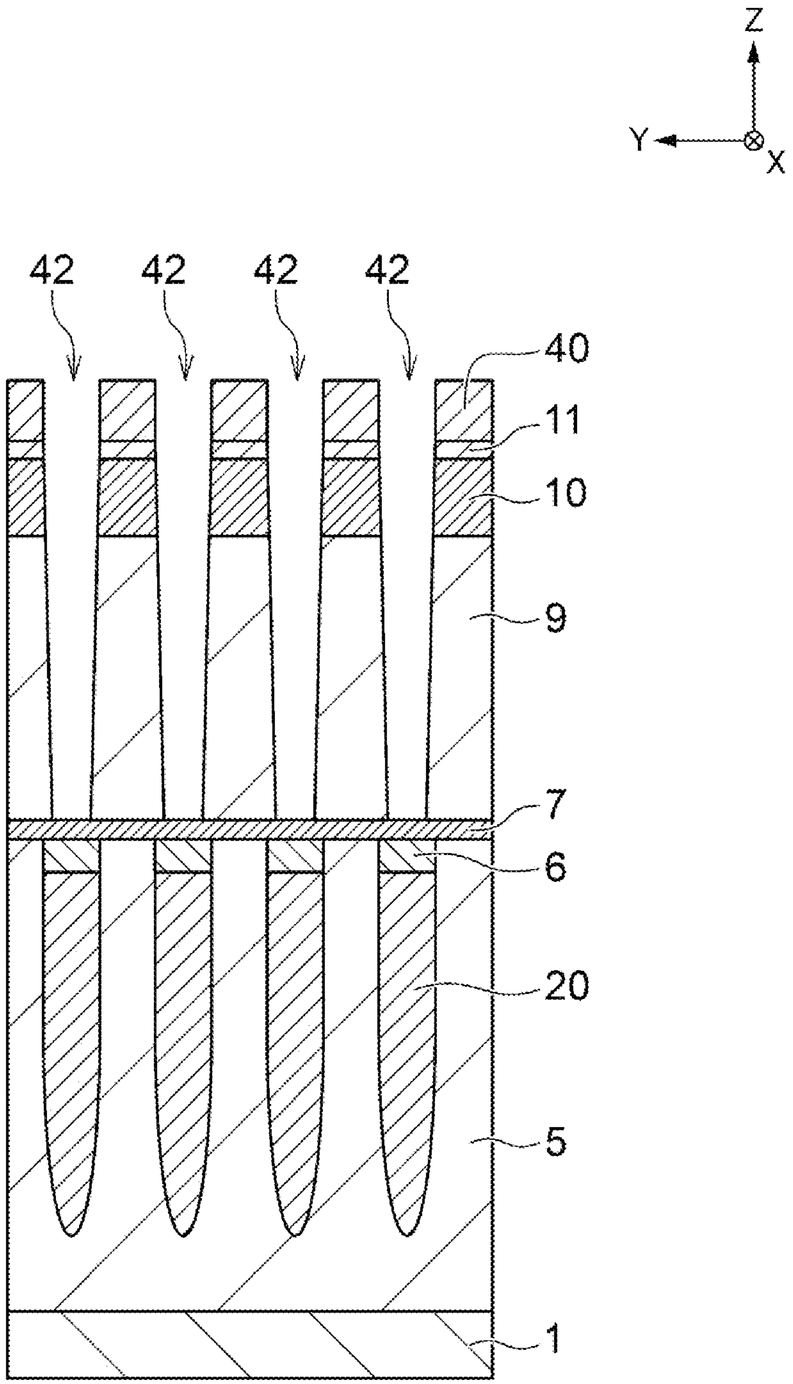
Figure 5C:
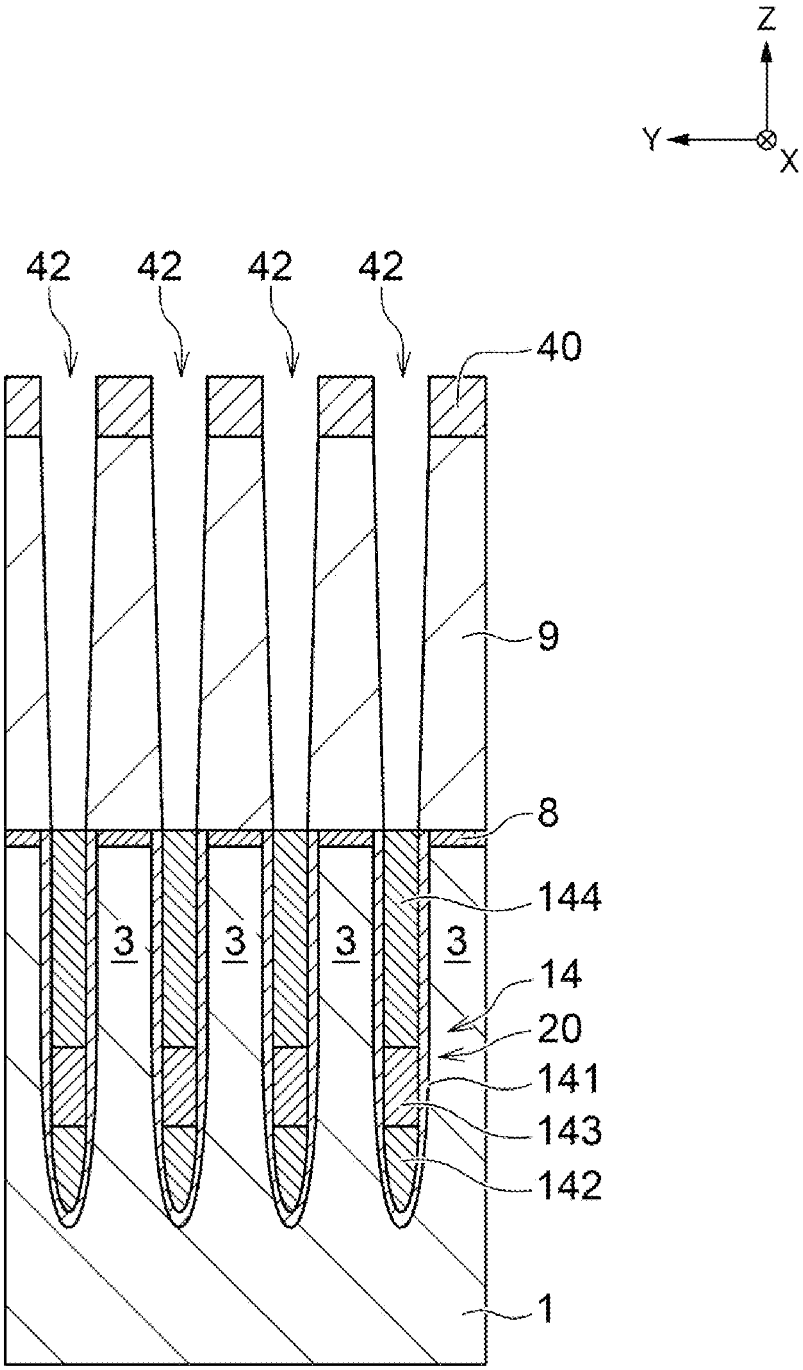
Figure 6A:
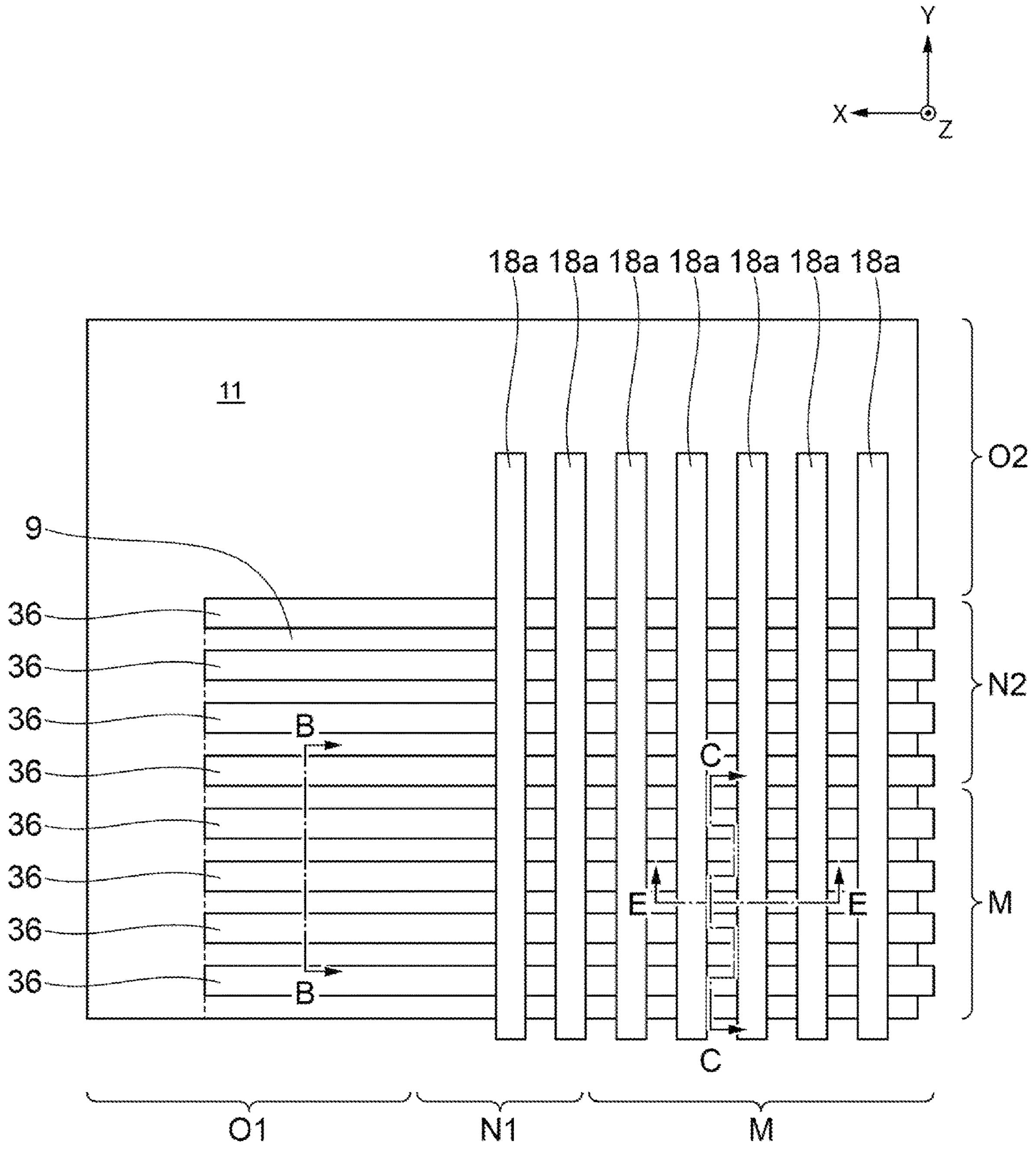
Figure 6B:
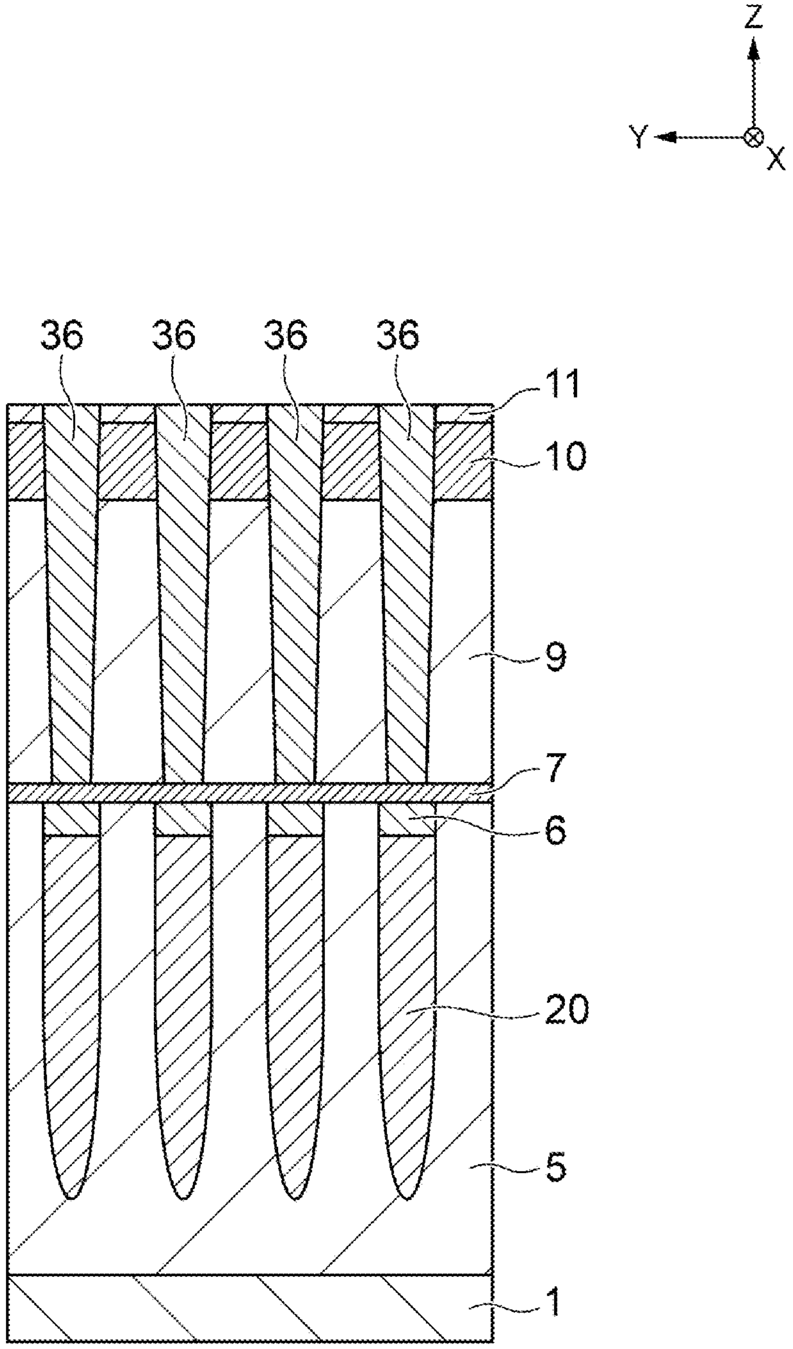
Figure 6C:
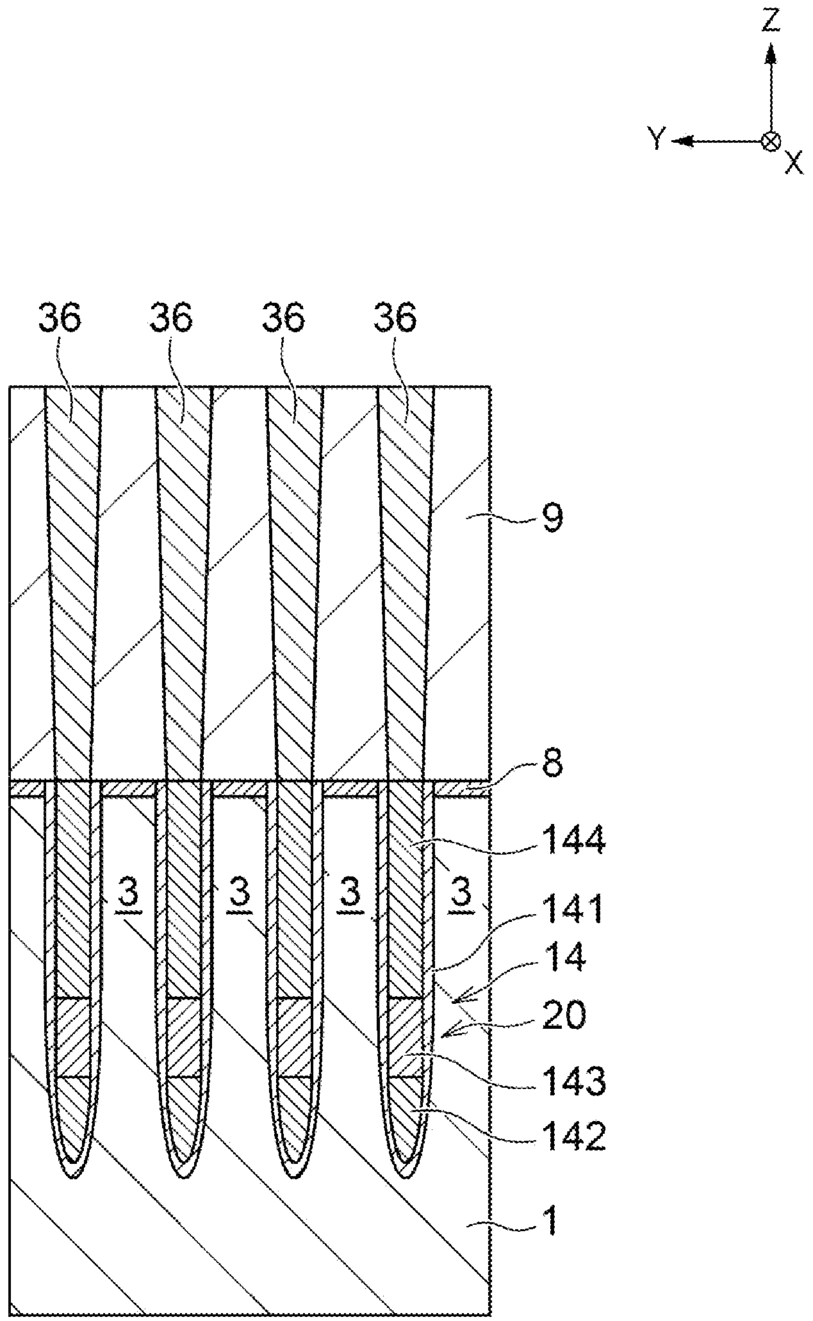
Figure 6D:
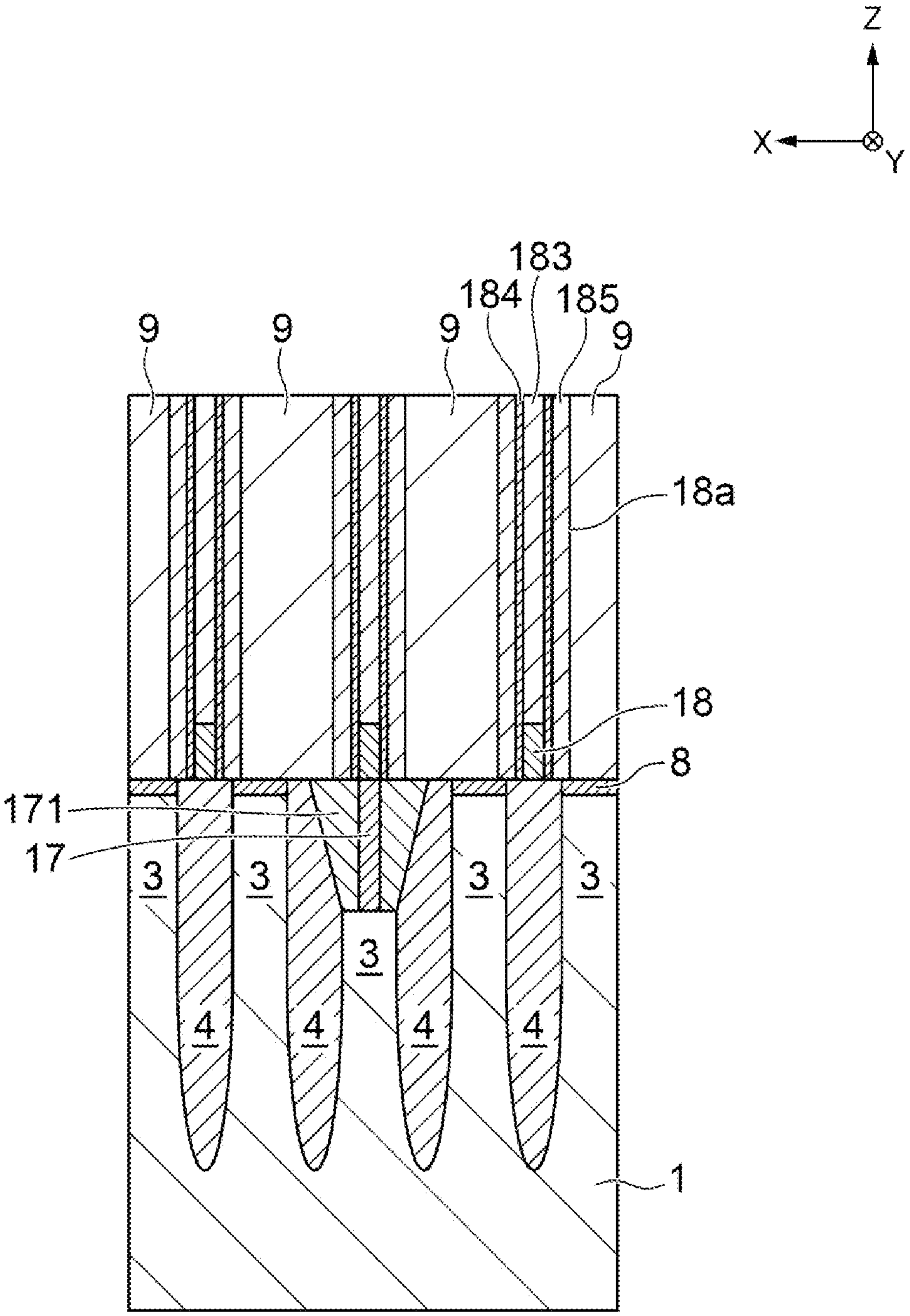
Figure 11A:
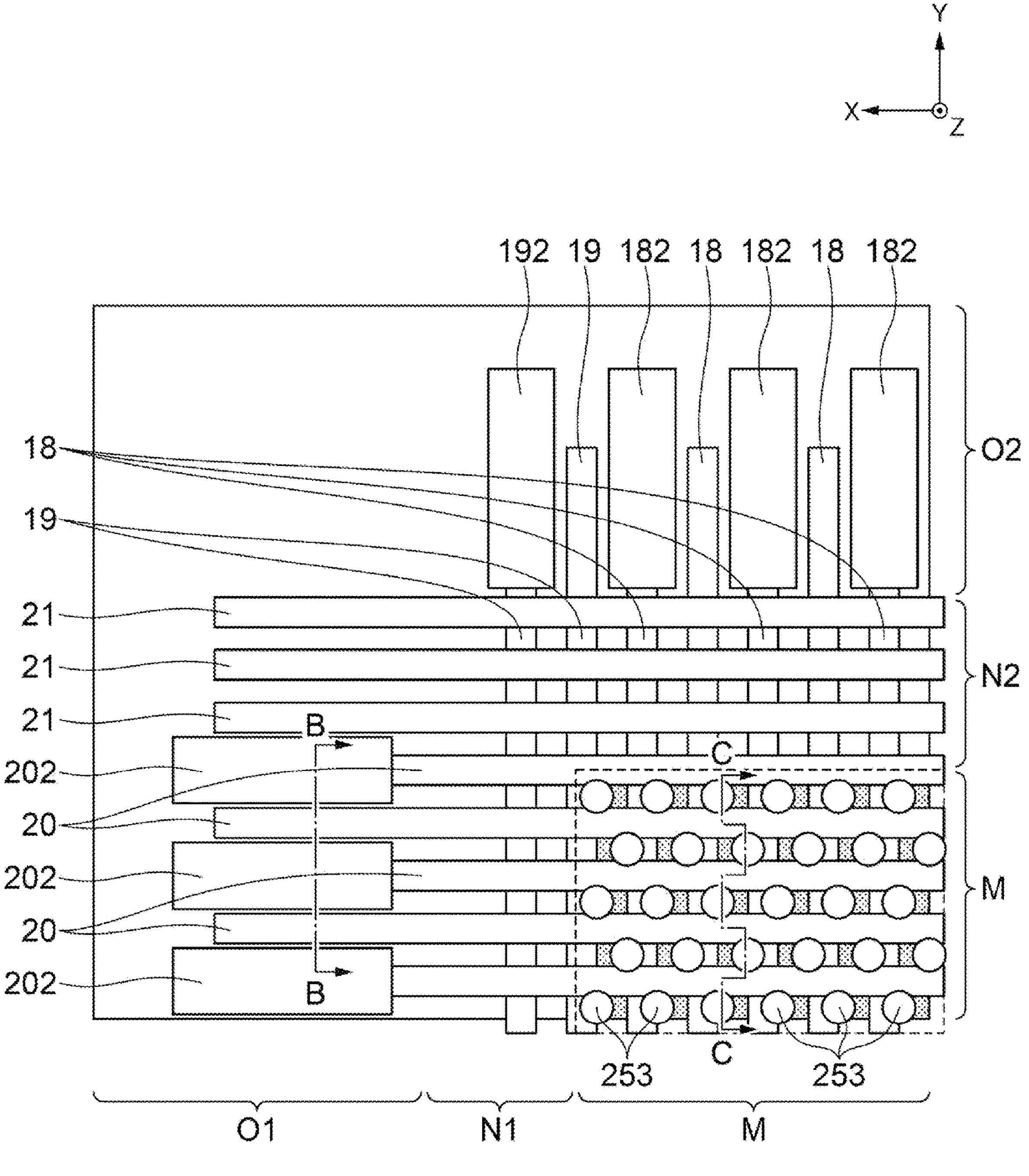
Figure 11B:
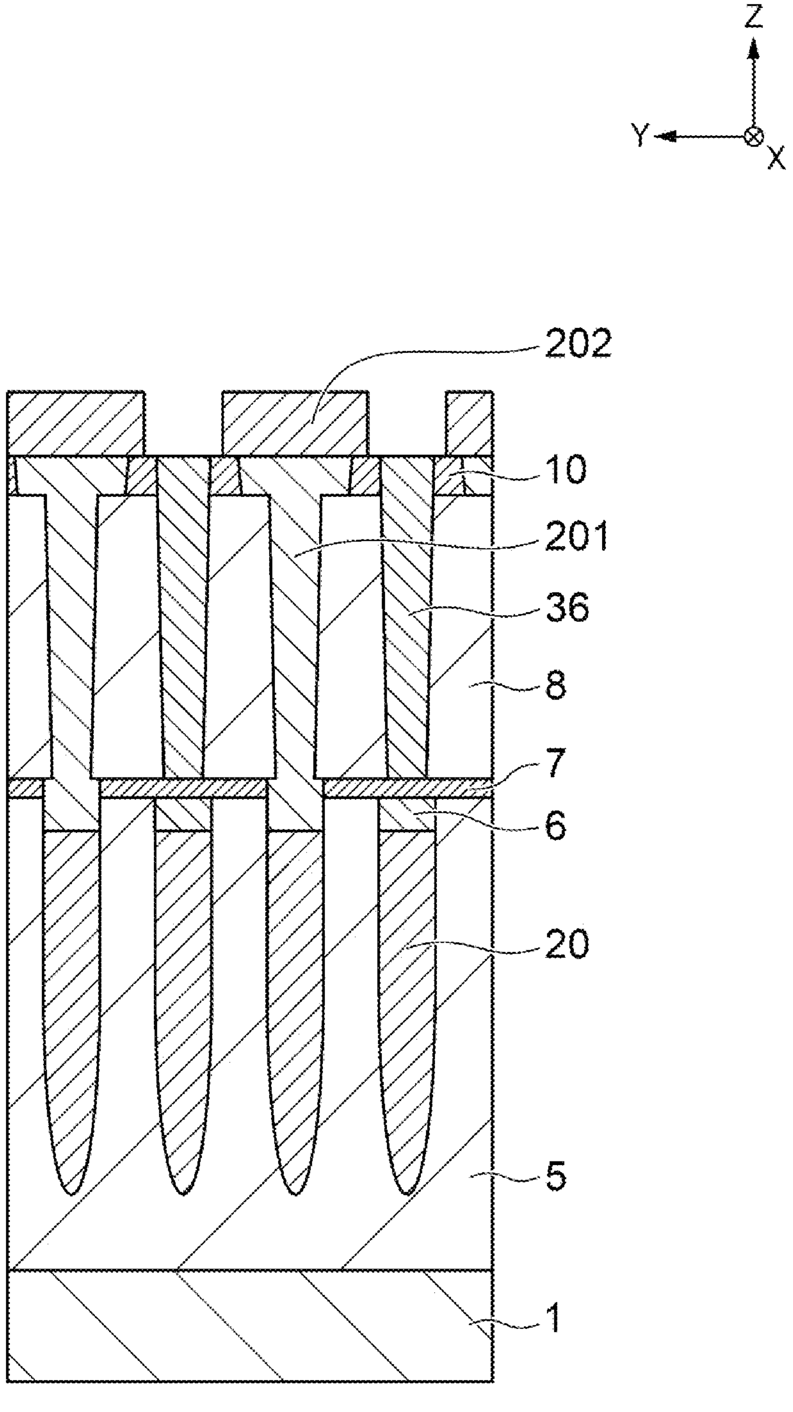
Figure 11C:
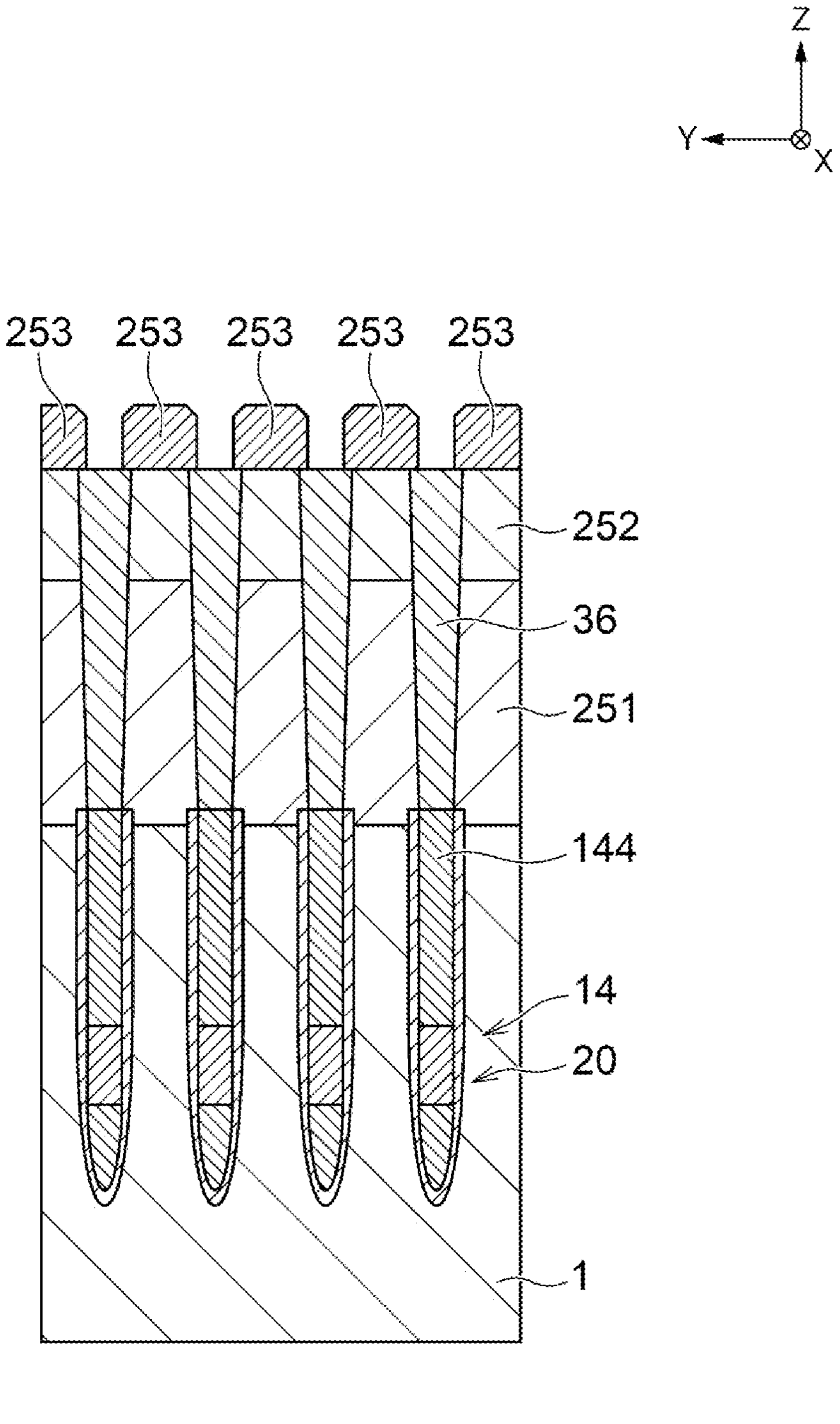

The diagrams shown in FIG. 3A to FIG. 3D are an example of a schematic configuration in an exemplary process stage subsequent to a process stage shown in FIG. 11A to FIG. 11C;

FIG. 3A to FIG. 11C are diagrams showing the semiconductor device according to the embodiment and a schematic configuration of a method of manufacturing the same, and are diagrams showing an example of the schematic configuration in an exemplary process stage in process sequence, in which FIGS. 3A, 4A, 5A, 6A, 7A, 8A, 9A, 10A and 11A are plan views showing an example of the schematic configuration in an exemplary process stage;

FIGS. 3B, 4B, 5B, 6B, 7B, 8B, 9B, 10B and 11B are vertical cross-sectional views showing schematic configurations of the portion taken along the line B-B in FIGS. 3A, 4A, 5A, 6A, 7A, 8A, 10A and 11A, respectively; and FIGS. 3C, 4C, 5C, 6C, 7C, 8C, 10C and 11C are vertical cross-sectional views showing scematic configurations of the portion taken along the line C-C of FIGS. 3A, 4A, 5A, 6A, 7A, 8A, 10A and 11A, respectively; and FIG. 3D is a vertical cross-sectional view showing a schematic configuration of a portion taken along a line D-D of FIG. 3A; and FIG. 6D is a vertical cross-sectional view showing a schematic configuration of a portion taken along a line E-E of FIG. 6A.

DETAILED DESCRIPTION

Various embodiments of the present disclosure will be explained below in detail with reference to the accompanying drawings. The following detailed description refers to the accompanying drawings that show, by way of illustration, specific aspects and various embodiments of the present disclosure. The detailed description provides sufficient detail to enable those skilled in the art to practice these embodiments of the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

A semiconductor device according to an embodiment and a method of manufacturing the same will be hereinafter described with reference to the drawings. In the following description, DRAM is exemplified as a semiconductor device. In the description of the embodiment, common or related elements, or substantially the same elements are designated by the same reference numerals, and the description thereof will be omitted. In the figures, the dimensions and dimensional ratios of the respective parts in the respective figures do not necessarily match the dimensions and dimensional ratios of those in the embodiment. The dimensions and dimensional ratios of the corresponding parts in the plan view and the vertical sectional view do not necessary match therebetween. A vertical direction in the following description means an up-and-down direction when a semiconductor substrate 1 is placed on a lower side.

Figure 1A:
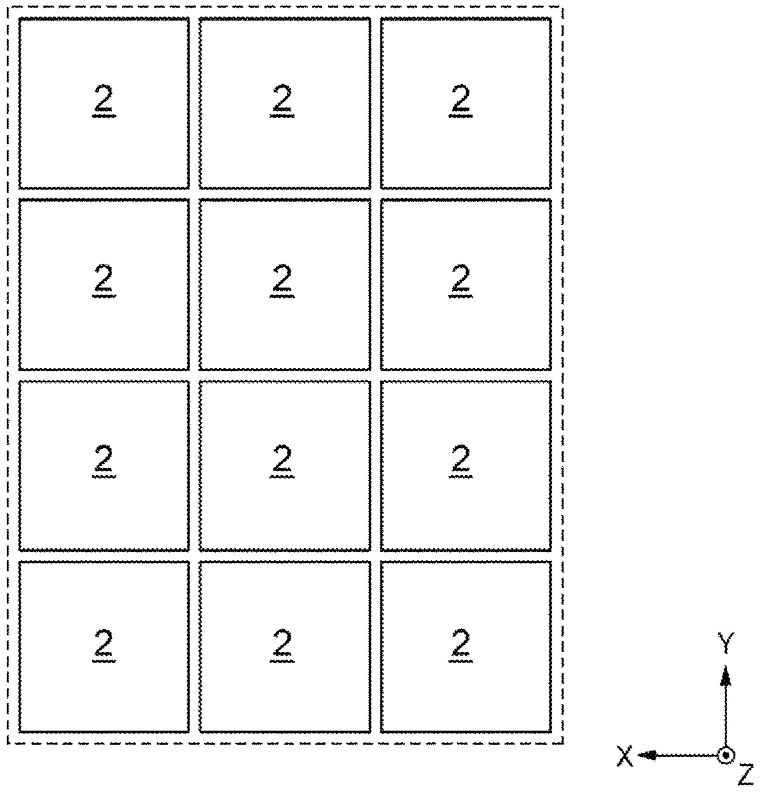
FIG. 1A is a plan view showing a schematic configuration of a part of a memory cell array region of a semiconductor device according to an embodiment.
Figure 1B:
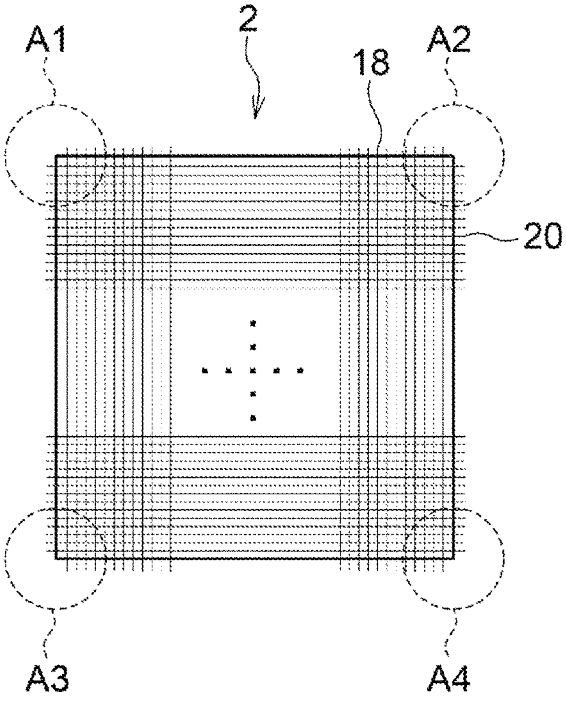
FIG. 1B is a plan view showing a schematic configuration of a memory mat.

FIG. 1A and FIG. 1B are diagrams showing a planar layout of the semiconductor device according to the embodiment. As shown in FIG. 1A, the semiconductor device comprises a plurality of memory mats 2 arranged in a matrix form on the surface of a semiconductor substrate. As shown in FIG. 1B, the memory mat 2 has a substantially rectangular shape, and includes four rectangular edge regions A1, A2, A3, and A4.

A plurality of word lines 20 are arranged in parallel on each memory mat 2 so as to extend in an X direction as shown in the figures. A plurality of bit lines 18 are arranged in parallel on each memory mat 2 so as to extend in a Y direction in the figures. The respective word lines 20 are connected to a row decoder (not shown) at a peripheral portion thereof. A direction parallel to the word lines 20, in other words, the X direction in the figures is referred to as a word line direction. A direction parallel to the bit lines 18, that is, the Y direction in the figures is referred to as a bit line direction.

The respective bit lines 18 are connected to a column decoder (not shown) at a peripheral portion thereof. When performing reading/writing on the memory cells, a selected column address is input from a column address buffer (not shown) to the column decoder. Each of the plurality of bit lines 18 is paired with an associated one of the plurality of memory cells to control access to a plurality of corresponding memory cells out of the plurality of memory cells.

Figure 2:
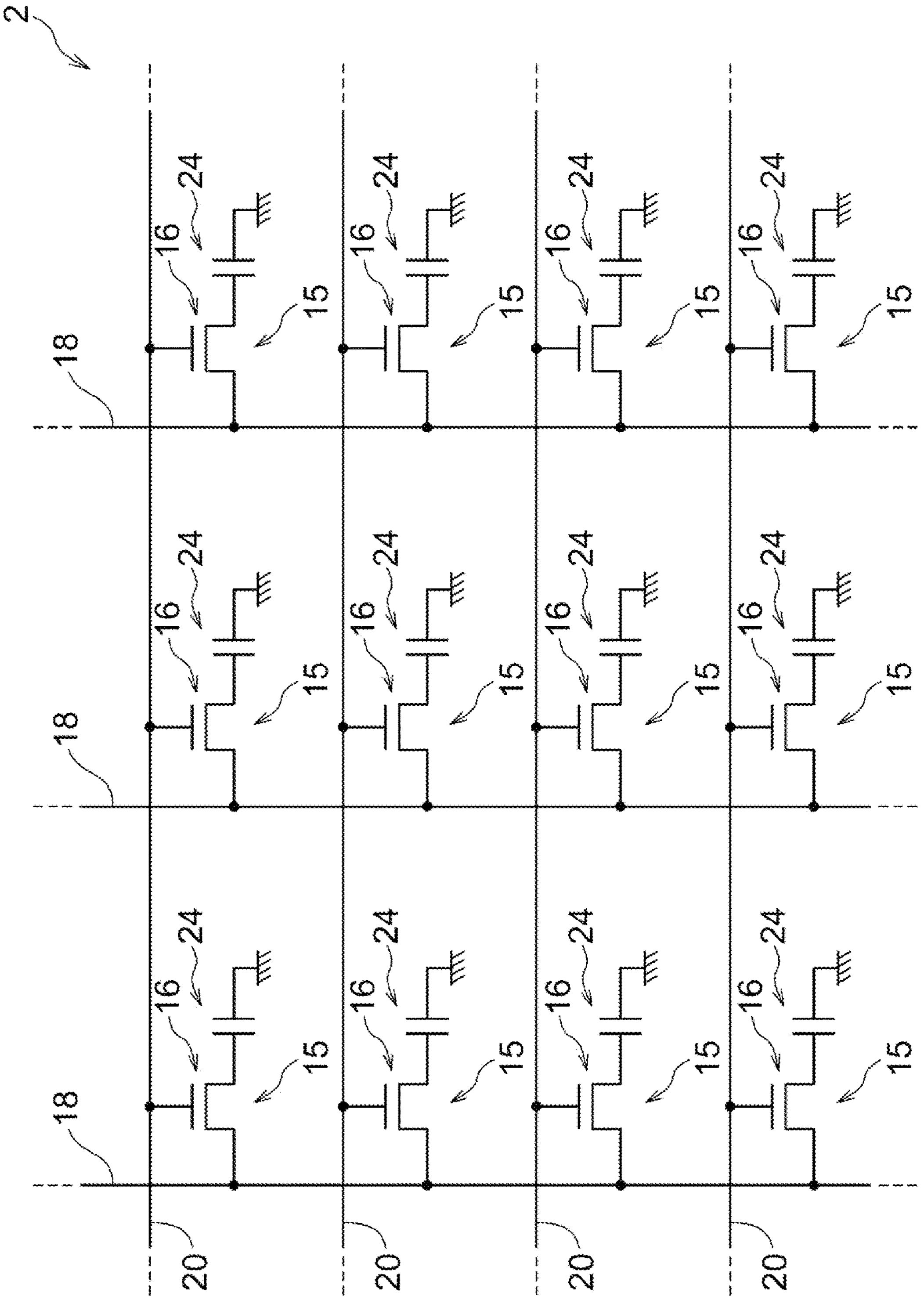
FIG. 2 is a circuit diagram showing an example of a schematic configuration of an equivalent circuit of a memory cell of the semiconductor device according to the embodiment.

FIG. 2 shows an equivalent circuit of a memory cell array of the semiconductor device according to the embodiment. The plurality of memory cells 15 are arranged in a matrix form while connected to the intersections between the plurality of word lines 20 and the plurality of bit lines 18, which are arranged so as to be orthogonal to each other. One memory cell 15 comprises a pair of access transistors 16 and a storage capacitor 24.

The access transistor 16 includes, for example, a metal-oxide-semiconductor field-effect transistor (MOSFET). The gate electrode of the access transistor 16 functions as a word line 20 of the DRAM. The word line 20 functions as a control line for controlling selection of the corresponding memory cell. One of the source and drain of the access transistor 16 is connected to a bit line 18, and the other is connected to a storage capacitor 24. The storage capacitor 24 includes a capacitor, and data is stored in the storage capacitor 24 by accumulating electric charges in the capacitor.

When data is written into a memory cell 15, a potential for turning on an access transistor 16 is applied to a word line 20, and a low potential or a high potential which corresponds to write data "0" or "1" is applied to a bit line 18. When data is read out from a memory cell 15, a potential for turning on an access transistor 16 is applied to a word line 20. As a result, a potential drawn out from a storage capacitor 24 to a bit line 18 is sensed by a sense amplifier connected to the bit line 18, thereby determining the data.

FIG. 3A is a planar layout diagram showing a schematic configuration of an edge region A1 shown in FIG. 1B. The planar layouts of the edge regions A2, A3, and A4 are set to be symmetrical with respect to the planar layout shown in FIG. 3A. The configurations of the edge regions A1, A2, A3, and A4, which include the cross-sectional structures thereof, are substantially the same. In the following description, the configuration of the edge region A1 will be described.

As shown in FIG. 3A, in the edge region A1, the semiconductor device includes a memory cell array region M, an X-direction dummy memory cell array region N1, a Y-direction dummy memory cell array region N2, an X-direction peripheral region O1, and a Y-direction peripheral region O2. The dummy memory cell array regions N1 and N2 surround the periphery of the memory cell array region M. The peripheral regions O1 and O2 surround the peripheries of the dummy memory cell array regions N1 and N2. A plurality of word lines 20 arranged in parallel at equal pitches in the Y direction are provided in the memory cell array region M, the dummy memory cell array region N1, and the X-direction peripheral region O1. A plurality of bit lines 18 arranged in parallel at equal pitches in the X direction are arranged orthogonally to the plurality of word lines 20 in the memory cell array region M, the dummy memory cell array region N2, and the Y-direction peripheral region O2. Active regions 3 of the memory cell are arranged at the intersections between the word lines 20 and the bit lines 18.

The bit lines 18 and the word lines 20 are extended from the memory cell array region M in parallel to the dummy memory cell array regions N1 and N2 and the peripheral regions O1 and O2. Word line contact electrodes 201 and word line extraction electrodes 202 connected to the corresponding word lines 20 are provided in the X-direction peripheral region O1. The word line contact electrodes 201 have a plug-like shape (e.g., contact electrodes 201 may be referred to as "contact plugs"). Further, peripheral bit line contact electrodes 181 and bit line extraction electrodes 182 connected to the corresponding bit lines 18 are provided in the Y-direction peripheral region O2. The word line contact electrodes 201 are connected to every other word line 20. The peripheral bit line contact electrodes 181 are connected to every other bit line 18.

In the dummy memory cell array region N1, a plurality of dummy bit lines 19 are arranged at the same pitch as the bit lines 18 in parallel with the bit lines 18. In the dummy memory cell array region N2, a plurality of dummy word lines 21 are arranged at the same pitch as the word lines 20 in parallel with the word lines 20. As shown in FIG. 3A, dummy bit line contact electrodes 191 and dummy bit line extraction electrodes 192 are connected to the dummy bit lines 19 so that the positional relationship of every other bit line containing the bit lines 18 and the dummy bit lines 19 continues.

The longitudinal direction of the active regions 3 is tilted at a predetermined angle with respect to the bit lines 18. The word line 20 functions as gate electrodes of access transistors of the memory cell provided in the active region 3. As described later, the bit line 18 is connected to a central portion of the active region 3 via a bit line contact 17 shown in FIG. 6D described later. Storage capacitors 24 are connected to both ends of the active region 3.

The word lines 20 are arranged so as to extend linearly from the memory cell array region M to the X-direction peripheral region O1 across the dummy memory cell array region N1. The word line contact electrodes 201 which are electrically connected to the word lines 20 are provided in the X-direction peripheral region O1.

The edge region A2 has a layout obtained by interchanging the arrangement of the word line contact electrodes 201 with respect to the arrangement of the edge region A1. In the edge region A2, the word line contact electrodes 201 are connected to word lines 20 to which the word line contact electrodes 201 are not connected in the edge region A1. Similar relationship is established in the edge region A3 and the edge region A4. The edge region A3 has a layout obtained by interchanging the arrangement of the peripheral bit line contact electrodes 181 with respect to the arrangement of the edge region A1. In the edge region A3, the peripheral bit line contact electrodes 181 are connected to bit lines 18 to which the peripheral bit line contact electrodes 181 are not connected in the edge region A1. Similar relationship is established in the edge region A2 and the edge region A4. Assuming that the plurality of word lines 20 are arranged so that even-numbered word lines 20 and odd-numbered word lines 20 are repeated, the word line contact electrodes 201 and the word line extraction electrodes 202 are connected to the even-numbered word lines 20 in the peripheral region O1. The word line contact electrodes 201 and the word line extraction electrodes 202 are connected to the odd-numbered word lines 20 in the peripheral region of the edge region A2. In the peripheral region O1, a fourth insulating film 8 is arranged over the plurality of word lines 20. In the peripheral region O1, the fourth insulating film 8 surrounds the plurality of word line contact electrodes 201 and insulating walls 36.

FIG. 3B is a vertical cross-sectional view showing a schematic configuration of a portion taken along a line B-B in FIG. 3A. FIG. 3C is a vertical cross-sectional view showing a schematic configuration of a portion taken along a line C-C of FIG. 3A. FIG. 3D is a vertical cross-sectional view showing a schematic configuration of a portion taken along a line D-D of FIG. 3A.

As shown in FIGS. 3A, 3B, 3C, and 3D, the semiconductor device according to the embodiment comprises a semiconductor substrate 1, a first insulating film 5, word lines 20, a second insulating film 6, a third insulating film 7, a fourth insulating film 8, insulating walls 36, a sixth insulating film 10, word line contact electrodes 201, word line extraction electrodes 202, and an eighth insulating film 12. The first insulating film 5 is arranged on the semiconductor substrate 1. A third insulating film 7 and a fourth insulating film 8 are provided on the first insulating film 5. A sixth insulating film 10 and an eighth insulating film 12 are further provided on the fourth insulating film 8.

The first insulating film 5 is provided with the word lines 20 in trenches provided in the first insulating film 5, and the second insulating film 6 is provided on the word lines 20.

The word line contact electrodes 201 and the word line extraction electrodes 202 are provided so as to be connected to every other word line 20. The eighth insulating film 12 is provided so as to cover the word line extraction electrodes 202. The insulating walls 36 are provided over the word lines 20. The insulating walls 36 are provided so as to extend continuously across the memory cell array region M, the dummy memory cell array region N1, and the peripheral region O1. The word line contact electrodes 201 penetrate the insulating walls 36 and reach the top surfaces of the word lines 20. Each of the word line contact electrodes 201 is connected to an associated one of the word lines. The insulating walls 36 are provided at least in the peripheral region O1.

As shown in FIG. 3C, in the memory cell array region M, the semiconductor device according to the embodiment comprises the semiconductor substrate 1, gate electrodes 14, the insulating walls 36, first capacitive contact electrodes 251, second capacitive contact electrodes 252, pad electrodes 253, the eighth insulating film 12, and storage capacitors 24. The gate electrodes 14 are formed in trenches provided in the semiconductor substrate 1.

The gate electrode 14 is configured by laminating a first conductive portion 142 and a second conductive portion 143. A cap insulating film 144 is laminated on the second conductive portion 143. The peripheries of the gate electrode 14 and the cap insulating film 144 are covered with a gate insulating film 141 to insulate the semiconductor substrate 1 and the gate electrode 14 from each other.

The storage capacitor 24 comprises a lower electrode 241, a capacitive insulating film 242, and an upper electrode 243. The capacitive insulating film 242 is arranged between the lower electrode 241 and the upper electrode 243. A capacitor is formed by the lower electrode 241, the capacitive insulating film 242, and the upper electrode 243. The lower electrode 241 is connected to the pad electrode 253.

The lower electrode 241 is electrically connected to the active region 3 via the pad electrode 253, the second capacitive contact electrode 252, and the first capacitive contact electrode 251. The cap insulating film 144 is arranged along the gate electrode 14 extending in the Y direction, and electrically insulates and separates the first capacitive contact electrode 251 and the second capacitive contact electrode 252 arranged adjacent to each other.

As shown in FIGS. 3B, 3C and 3D, the word lines 20 are provided so as to extend across the memory cell array region M, the dummy memory cell array region N1, and the X-direction peripheral region O1. In the memory cell array region M, the word lines 20 function as the gate electrodes 14 of the memory cells 15. In the X-direction peripheral region O1, the word line 20 includes a first conductive portion 142. The insulating walls 36 are arranged over the word lines 20 in the memory cell array region M, the dummy memory cell array region N1, and the X-direction peripheral region O1. Isolations 4 are formed in the semiconductor substrate 1.

Next, a method of manufacturing the semiconductor device according to the embodiment will be described with reference to FIG. 3A to FIG. 11C. The figures from FIG. 3A to FIG. 11C are diagrams showing the schematic configuration of the edge region A1 shown in FIG. 1B in process sequence.

First, as shown in FIGS. 4A, 4B and 4C, the first insulating film 5 is formed in a groove formed on the semiconductor substrate 1 in the X-direction peripheral region O1. The word lines 20 are provided in trenches formed in the semiconductor substrate 1 in the memory cell array region M and the dummy memory cell array regions N1 and N2, and a peripheral isolation insulating film 12 in the X-direction peripheral region O1. In the memory cell array region M and the dummy memory cell array regions N1 and N2, the gate insulating film 141, the first conductive portion 142, the second conductive portion 143, and the cap insulating film 144 are provided in the trenches. In the peripheral regions O1 and O2, the first conductive portions 142 are provided in the trenches. In the memory cell array region M and the dummy memory cell array regions N1 and N2, the fourth insulating film 8 is provided on the semiconductor substrate 1.

For example, a silicon monocrystal substrate is used as the semiconductor substrate 1. The first insulating film 5 is formed by forming a groove in the peripheral regions O1 and O2 of the semiconductor substrate 1 and filling the groove with an insulator comprising, for example, silicon nitride (SiN), silicon dioxide ($SiO_2$), or the like. Trenches in which the word lines 20 are formed are formed by using known lithography technique and dry etching technique. The dry etching is performed under a condition that the etching rates of the semiconductor substrate 1 and the first insulating film 5 are substantially equal to each other.

The gate insulating film 141 contains, for example, silicon dioxide. The gate insulating film 141 is formed, for example, by subjecting the semiconductor substrate 1 to thermal oxidation. The first conductive portion 142 includes a conductive material, for example, includes titanium nitride (TiN). The second conductive portion 143 includes a conductive material, for example, includes polysilicon (Si) doped with impurities such as phosphorus (P) or arsenic (As). The cap insulating film 144 includes, for example, silicon nitride (SiN). The first conductive portion 142, the second conductive portion 143, and the cap insulating film 144 are formed, for example, by forming conductive materials in the trenches using a known chemical vapor deposition (CVD) and then performing etch-back by anisotropic dry etching. In some embodiments, the trenches are filled with a first conductive film, which is then etched back to a middle of the trenches in the memory cell array region to expose an upper portion of the trenches in the memory cell array region. The upper portion of the trenches in the memory cell array region is filled with a second conductive film. The first conductive film in the trenches represents first conductive portions 142, and the second conductive film in the upper portion of the trenches represents second conductive portions 143.

As shown in FIG. 4B, the second insulating film 6 is formed over the word lines 20 in the X-direction peripheral region O1. The third insulating film 7, the fifth insulating film 9, the sixth insulating film 10, and the seventh insulating film 11 are formed over the second insulating film 6 and the first insulating film 5. The second insulating film 6, the third insulating film 7, and the sixth insulating film 10 contains, for example, silicon nitride (SiN). The fifth insulating film 9 and the seventh insulating film 11 include silicon dioxide. The second insulating film 6, the third insulating film 7, the fifth insulating film 9, the sixth insulating film 10, and the seventh insulating film 11 are formed, for example, by using the CVD technique.

As shown in FIG. 4C, the fourth insulating film 8 is provided on the semiconductor substrate 1 in the memory cell array region M. The trenches in which the word lines 20 will be formed are provided in the fourth insulating film 8 and the semiconductor substrate 1. The fifth insulating film 9 and the seventh insulating film 11 are provided over the fourth insulating film 8 and the cap insulating film 144. The fourth insulating film 8 and the seventh insulating film 11 contain, for example, silicon nitride (SiN). The fifth insulating film 9 includes, for example, silicon dioxide. The fourth insulating film 8, the fifth insulating film 9, and the seventh insulating film 11 are formed, for example, by using the CVD technique.

As shown in FIGS. 4A, 4B and 4C, a plurality of etching masks 40 are formed over the semiconductor substrate 1 on which the above members are formed. The etching masks 40 contain, for example, polysilicon. The etching masks 40 are formed, for example, by patterning polysilicon using a known double patterning technique or a quad patterning technique. The plurality of etching masks 40 each linearly extend in the Y direction, and are arranged in parallel at a predetermined pitch in the X direction. Each of the plurality of etching masks 40 is arranged above between adjacent word lines 20 of the plurality of word lines 20.

Further, a resist 44 is formed so as to cover the peripheral regions O1 and O2. The resist 44 is formed by using a known lithography technique. The resist 44 is not formed over the memory cell array region M and the dummy memory cell array regions N1 and N2, and is opened over these regions.

Next, as shown in FIGS. 5A, 5B and 5C, anisotropic dry etching is performed by using the resist 44 and the etching masks 40. This etching is performed so as to stop on the third insulating film 7 and on the cap insulating film 144. As a result, the seventh insulating film 11, the sixth insulating film 10, and the fifth insulating film 9 in regions covered with neither the resist 44 nor the etching masks 40 are removed by etching.

By this step, trenches 42 are formed just above the word lines 20 in the memory cell array region M, the dummy memory cell array regions N1 and N2, and the X-direction peripheral region O1.

Next, as shown in FIGS. 6A, 6B, 6C and 6D, after removing the etching masks 40 and the resist 44, the insulating walls 36 are filled in the trenches 42. The insulating wall 36 includes an insulating film, and for example, contains silicon nitride (SiN). The insulating walls 36 are formed, for example, by forming an insulating film in the trenches 42 and on the fifth insulating film 9 using the CVD technique and then performing etch-back using anisotropic dry etching to cause the insulating film to remain in the trenches 42. The side surfaces of the insulating walls 36 are covered with the fifth insulating film 9. The insulating walls 36 are pinched by the fifth insulating film 9. In a cross-sectional view shown in FIG. 6D, no trench 42 is formed because the etching masks 40 are provided.

As shown in FIG. 6D, in the central portion of the active region 3, the bit line 18 and the active region 3 are connected to each other by a bit line contact 17. The active region 3 is partitioned by the isolation 4. The periphery of the bit line contact 17 is surrounded by a bit line contact insulating film 171 to insulate between the bit line contact 17 and the word line 20 adjacent thereto. The bit line contact 17 contains polysilicon (Poly-Si) doped with impurities such as phosphorus. The bit line contact insulating film 171 includes, for example, silicon nitride (SiN).

The top surfaces and side surfaces of the bit line 18 are surrounded by a bit line insulating film 18*a*. The bit line insulating film 18*a* comprises a laminated film of a first bit line insulating film 183, a second bit line insulating film 184, and a third bit line insulating film 185. The first bit line insulating film 183 is provided on the upper portion of the bit line 18 so as to extend in the Z direction. The second bit line insulating film 184 and the third bit line insulating film 185 are provided so as to be laminated on the side surfaces of the bit line 18 and the first bit line insulating film 183.

The first bit line insulating film 183 and the third bit line insulating film 185 contain silicon nitride. The second bit line insulating film 184 includes a silicon acid carbide (SiOC) which is a low-K film having a low relative permittivity. A fifth insulating film 9 is provided between the bit line insulating films 18*a*. In the steps described with respect to FIGS. 5A to 5C, no etching is performed because the etching masks 40 are provided on the top surfaces of the bit line insulating film 18*a* and the fifth insulating film 9, and the bit line insulating film 18*a* and the fifth insulating film 9 remain.

Figure 7A:
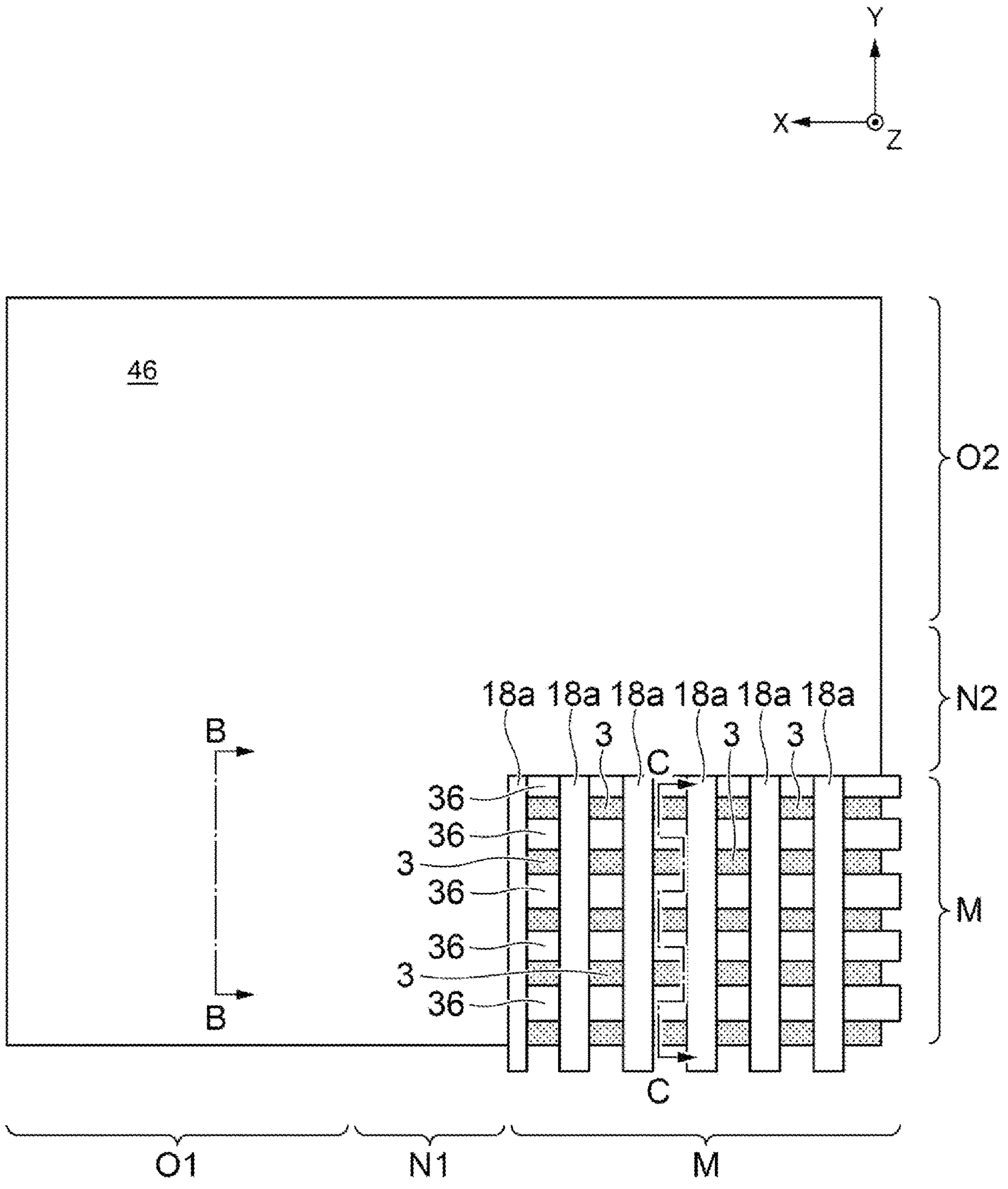
Figure 7B:
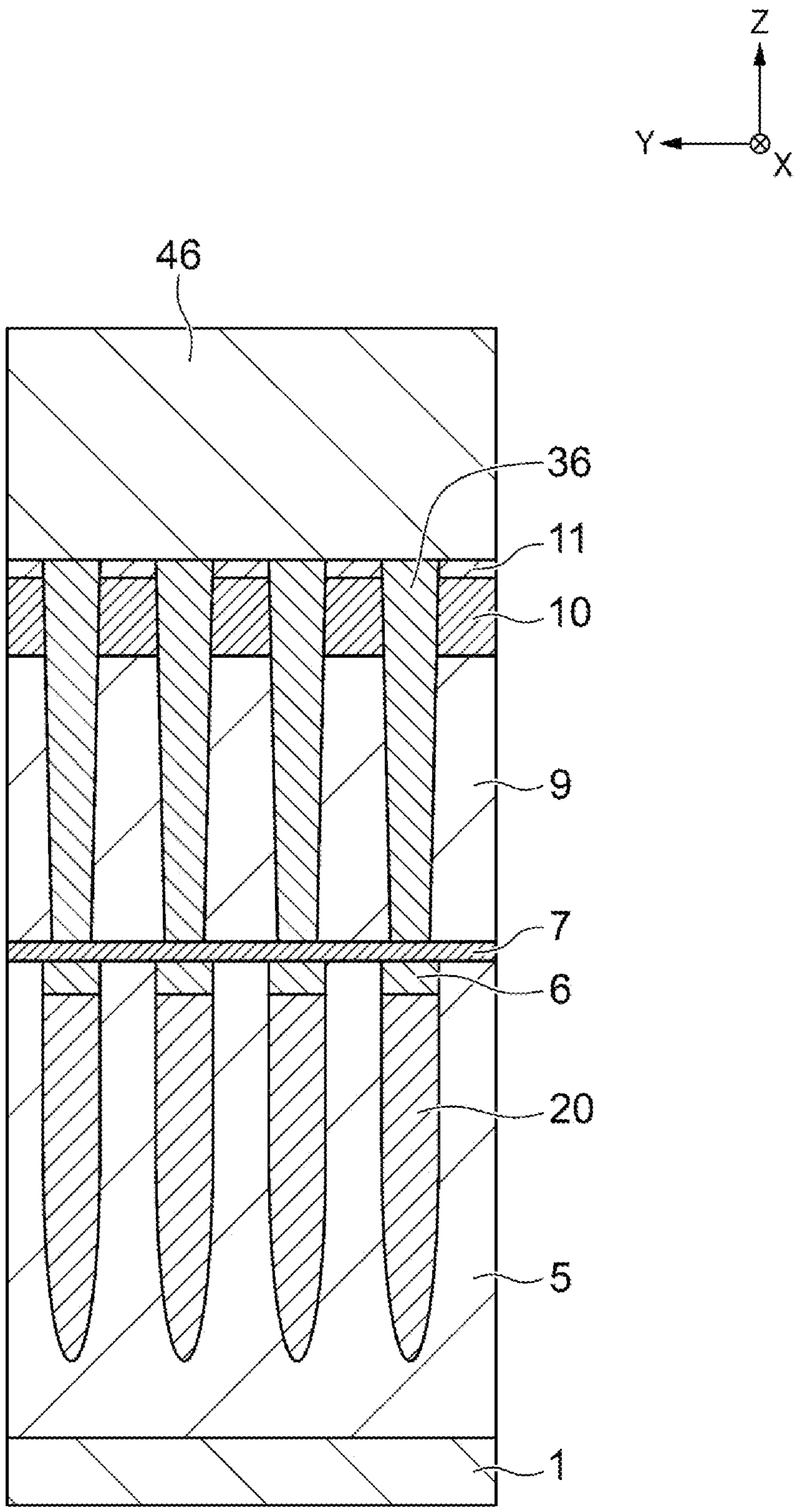
Figure 7C:
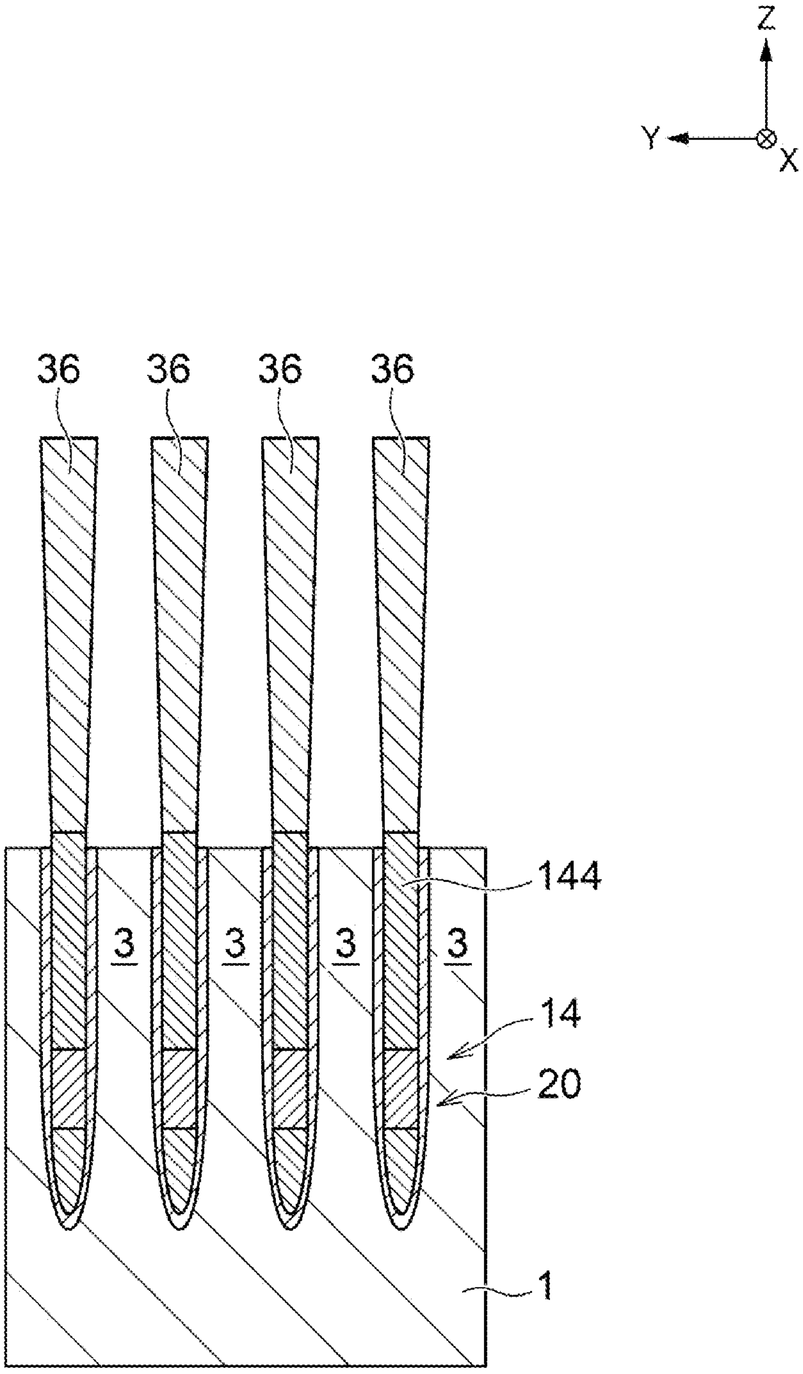

Next, as shown in FIGS. 7A, 7B and 7C, a resist 46 is formed in the dummy memory cell array regions N1 and N2 and the peripheral regions O1 and O2. The resist 46 is not provided in the memory cell array region M, but is opened in the memory cell array region M.

Next, anisotropic dry etching is performed on the memory cell array region M with the resist 46 as a mask. This anisotropic dry etching is performed under a condition that the etching rates of silicon nitride and silicon are low and the etching rate of silicon dioxide is higher than those of silicon nitride and silicon. As shown in FIGS. 7A and 7C, this etching leaves the insulating walls 36 and the bit line insulating film 18*a* in the memory cell array region M, removes the fifth insulating film 9 and the fourth insulating film 8, and exposes the surfaces of the third insulating film 7 and the active regions 3. The insulating walls 36 are formed to have a wall shape extending in the X direction. As shown in FIG. 7B, the X-direction peripheral region O1 is not changed by this etching because the X-direction peripheral region O1 is masked by the resist 46.

Figure 8A:
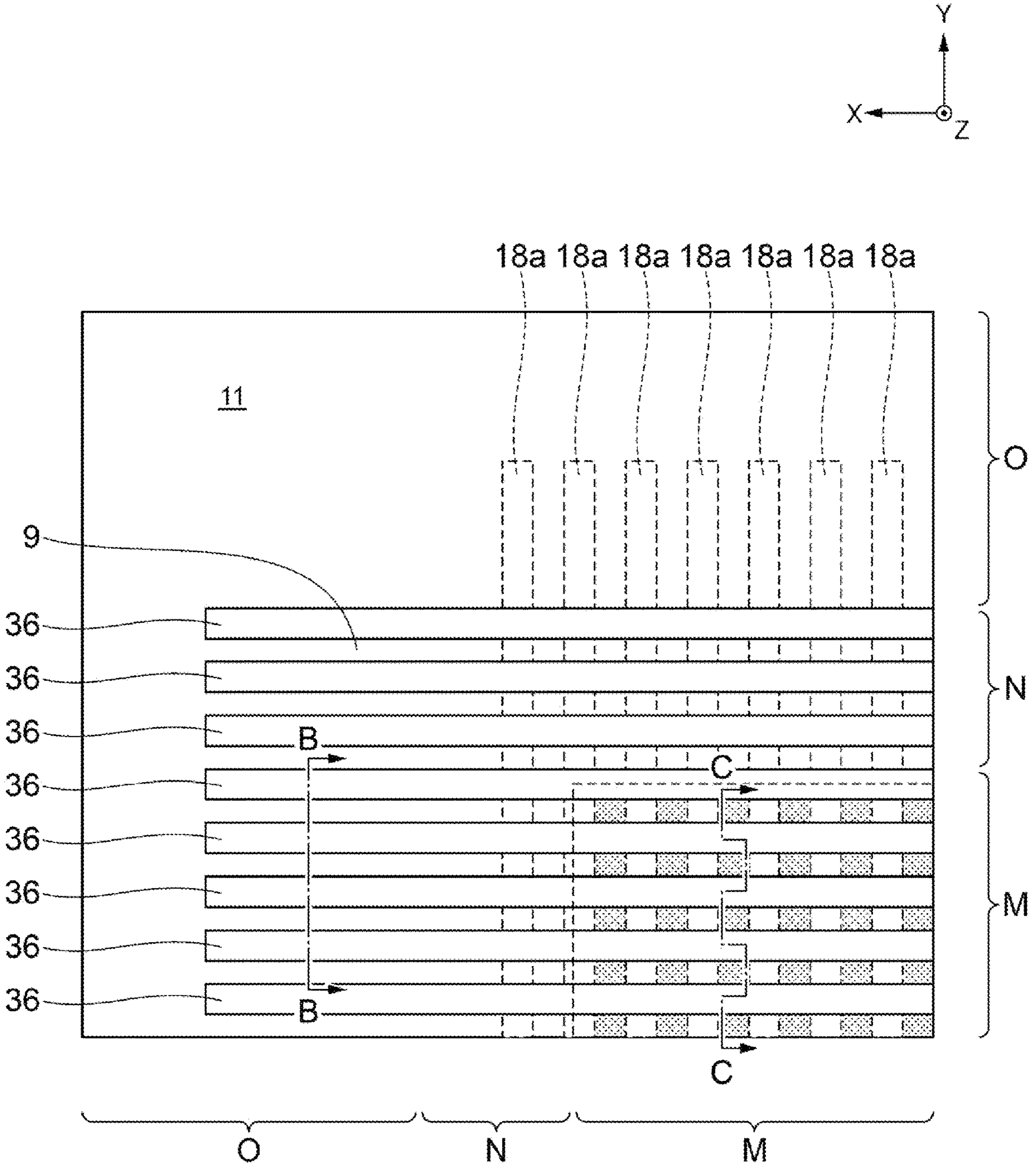
Figure 8B:
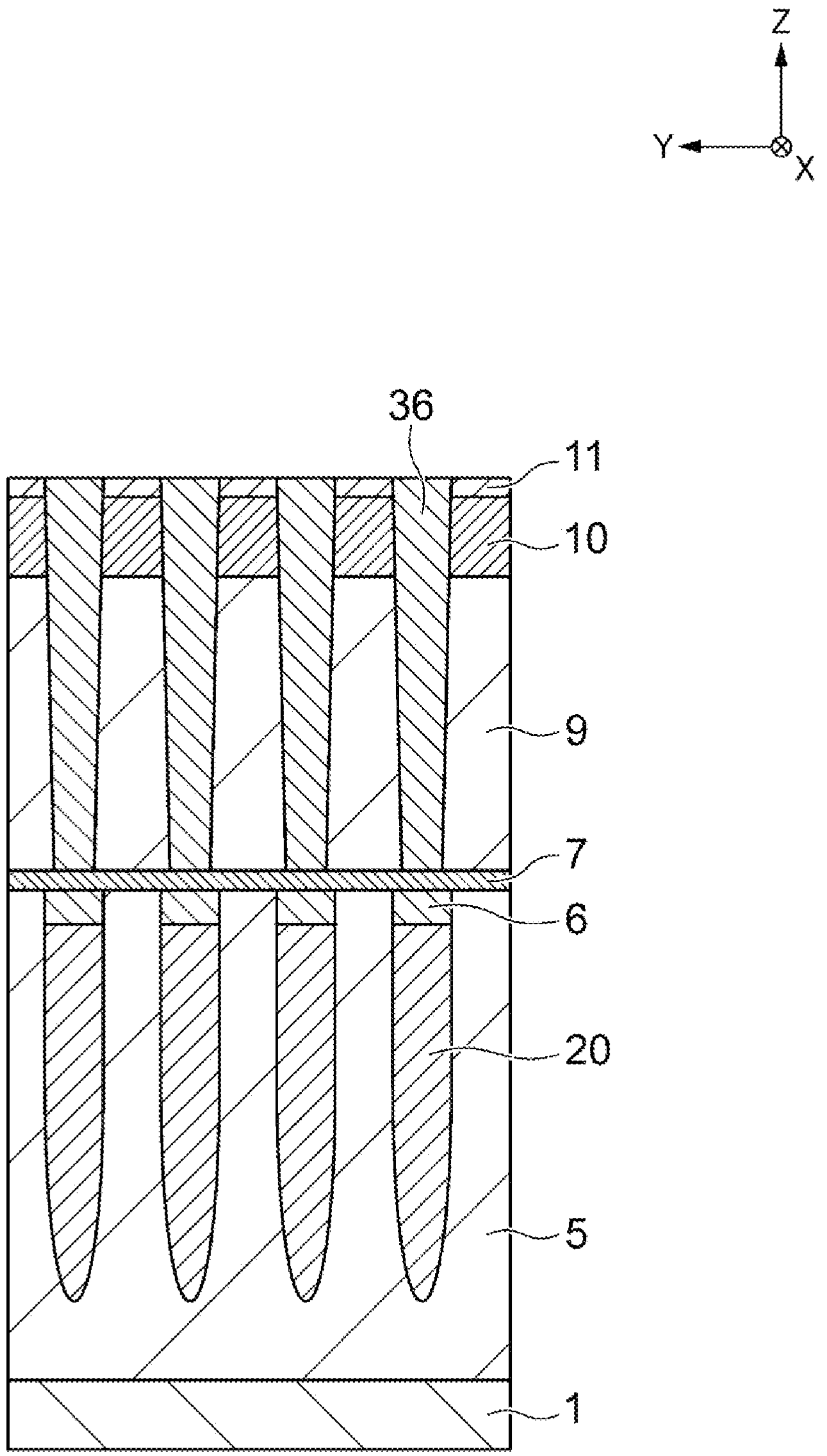
Figure 8C:
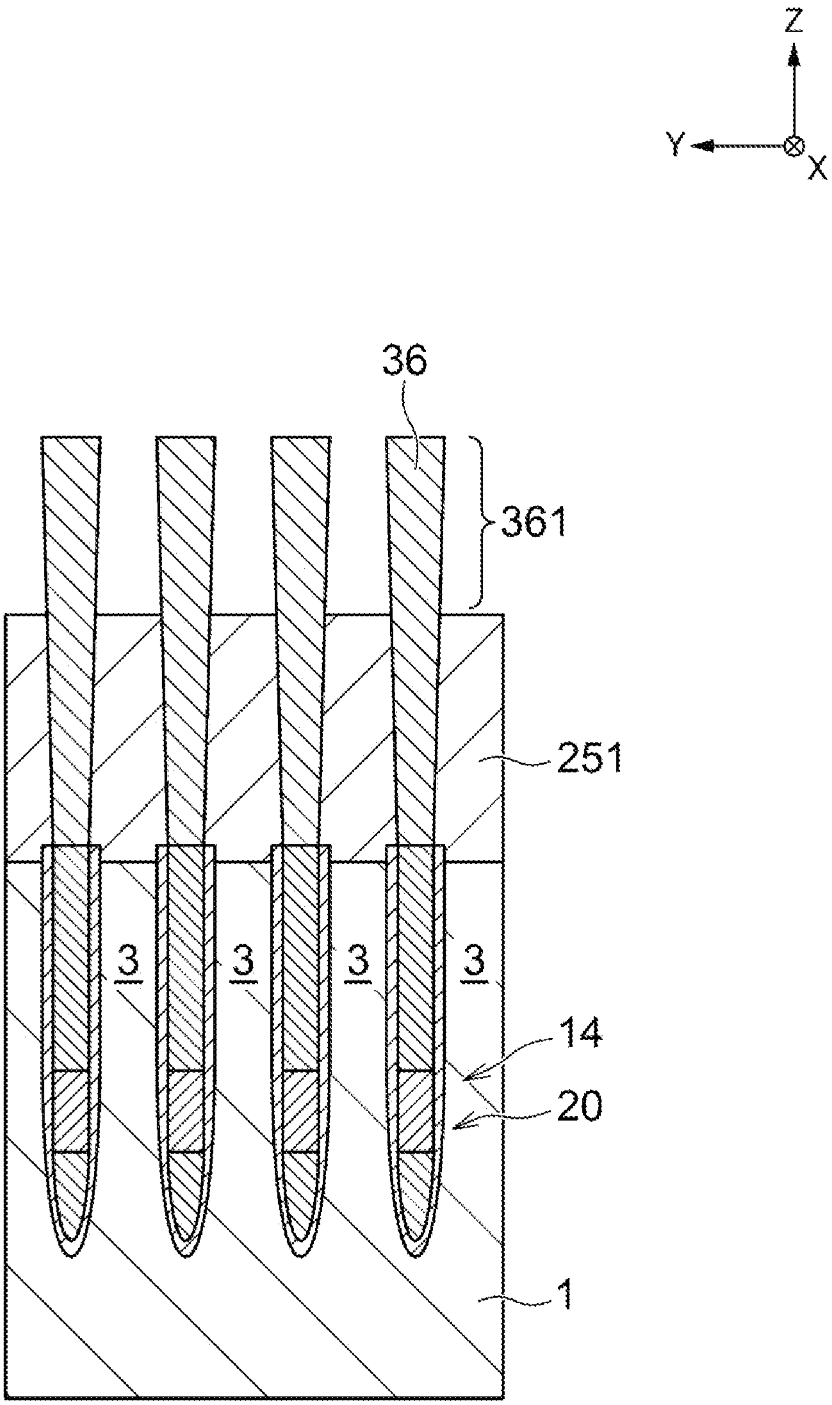

Next, the resist 46 is removed as shown in FIGS. 8A, 8B and 8C. Thereafter, polysilicon 25*a* doped with impurities such as phosphorus is formed on the surfaces of the memory cell array region M, the dummy memory cell array regions N1 and N2, and the peripheral regions O1 and O2 so as to be filled between a plurality of insulating walls 36 of the memory cell array region M. Next, etch back is performed on the polysilicon 25*a*. The polysilicon 25*a* contains silicon, and is formed, for example, by the CVD technique. The etch back is performed, for example, by using anisotropic or isotropic dry etching. The etch back is performed under a condition that the etching rates of silicon dioxide and silicon nitride are low and the etching rate of polysilicon is high.

The polysilicon 25*a* is etched back to the extent that upper parts 361 of the insulating walls 36 are exposed and lower parts of the insulating walls 36 are filled with the remaining polysilicon 25*a*. The remaining polysilicon 25*a* will serve as the first capacitive contact electrodes 251. The first capacitive contact electrodes 251 are connected to the active regions 3.

Figure 9A:
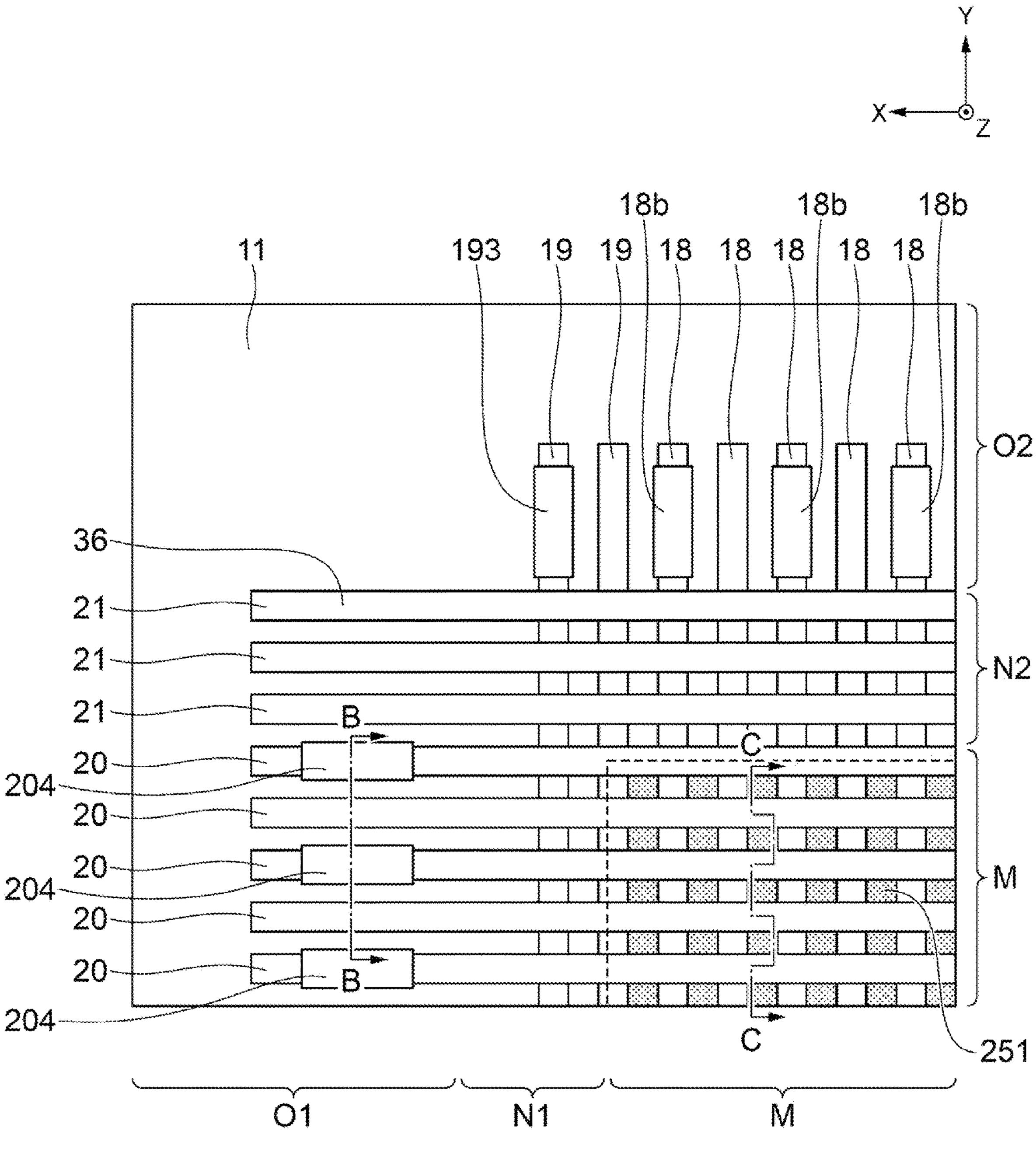
Figure 9B:
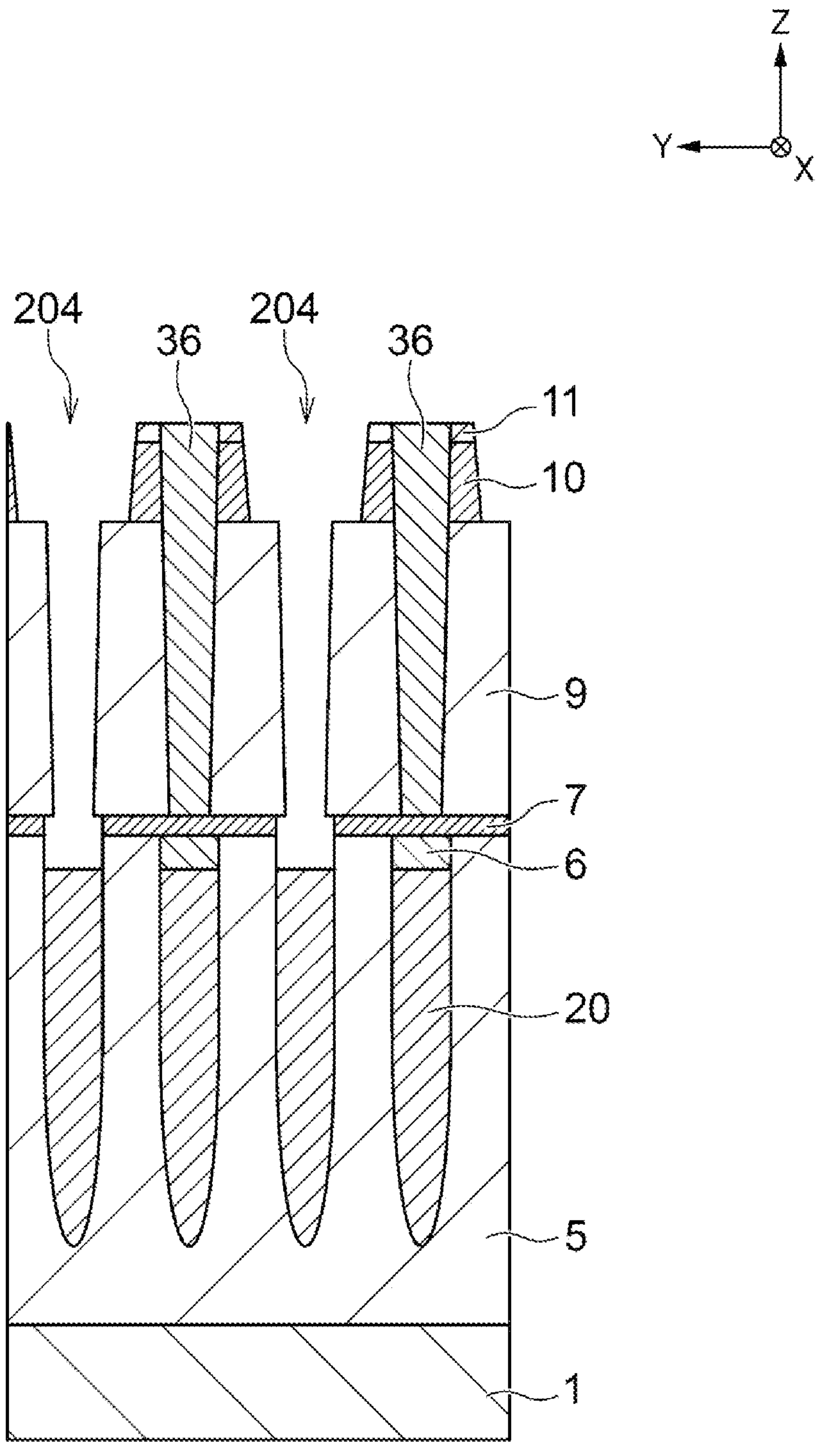

Next, as shown in FIGS. 9A and 9B, word line contact holes 204 are formed above the word lines 20 in the X-direction peripheral region O1. The formation of the word line contact holes 204 is performed by a known lithography technique and anisotropic dry etching. The anisotropic dry etching is performed under a condition that the etching rate of silicon nitride is high and the etching rate of silicon dioxide is low.

The insulating walls 36, the third insulating film 7, and the second insulating film 6 are etched in the word line contact holes 204 by the above step. The seventh insulating film 11 and the sixth insulating film 10 are etched at the upper portions of the word line contact holes 204. The top surfaces of the word lines 20 are exposed at the bottom portions of the word line contact holes 204.

In this etching, the etching rate of the fifth insulating film 9 containing silicon dioxide is low, so that displacement of the word line contact holes 204 in the lateral direction is suppressed even if the position of a resist for forming the word line contact holes 204 is displaced. Therefore, even if a word line contact hole 204 expands to an adjacent word line 20 due to a pretreatment performed before a film of a conductive material is formed in the word line contact holes 204, it is possible to suppress occurrence of a short circuit between adjacent word lines 20 when the conductive material is filled in the word line contact holes 204.

Figure 10A:
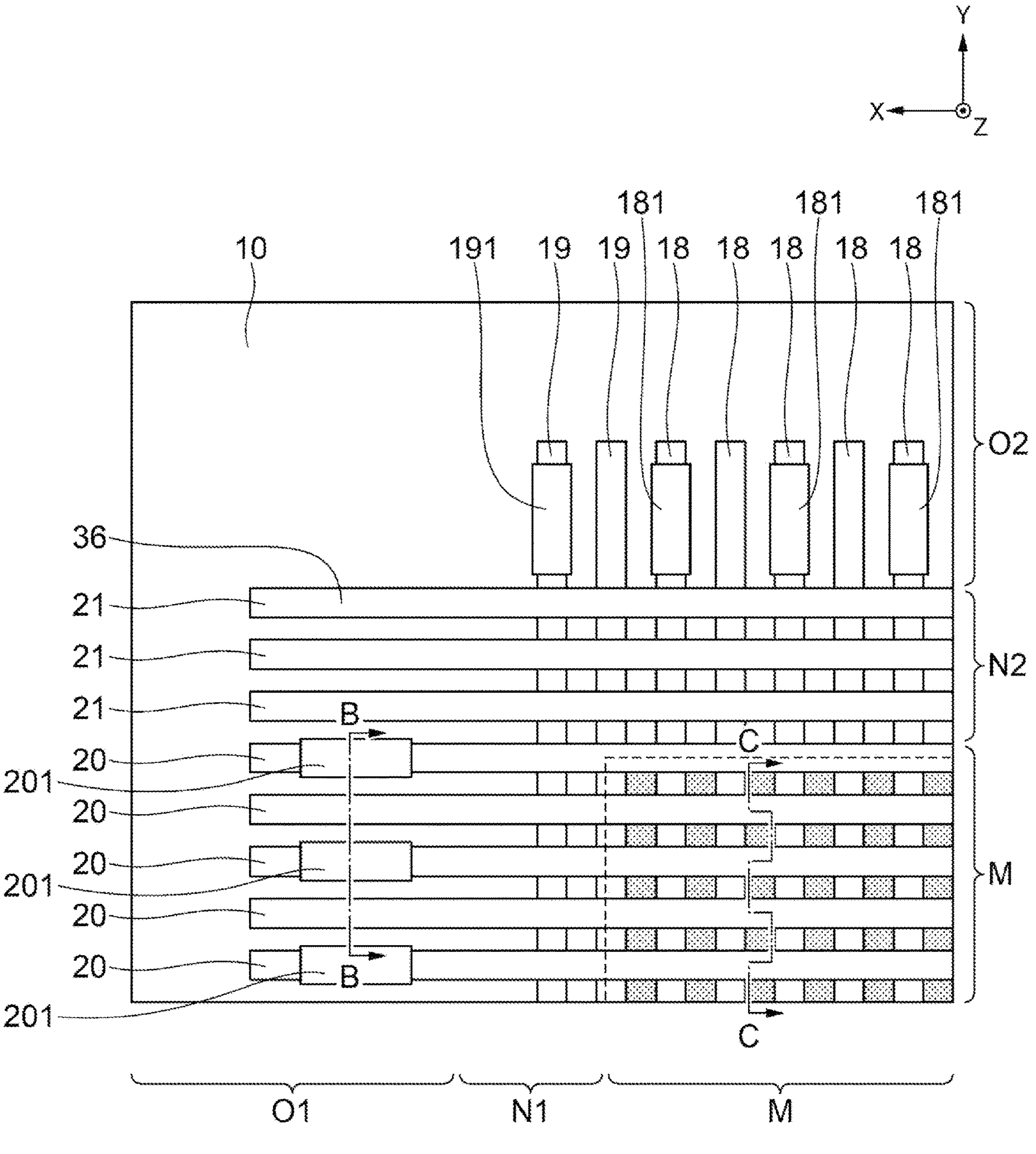
Figure 10B:
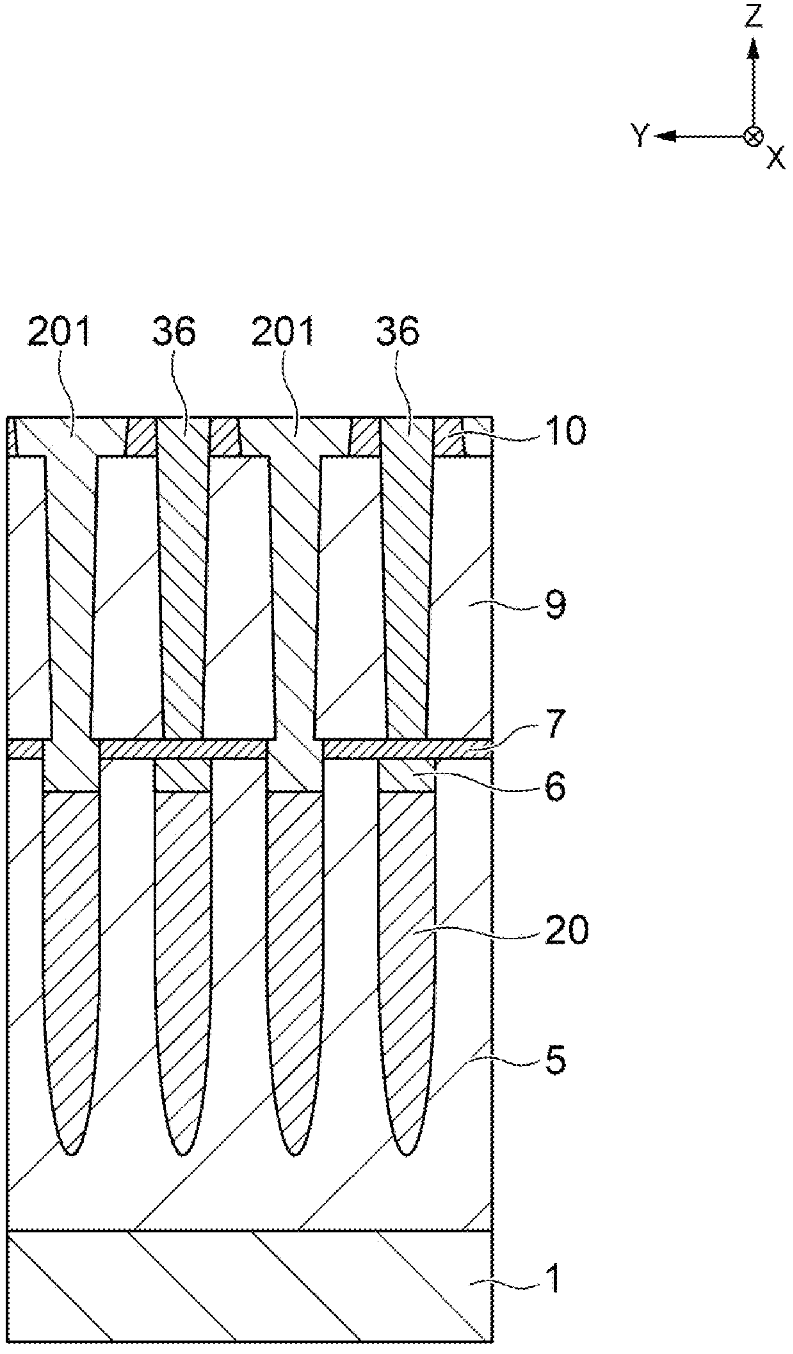
Figure 10C:
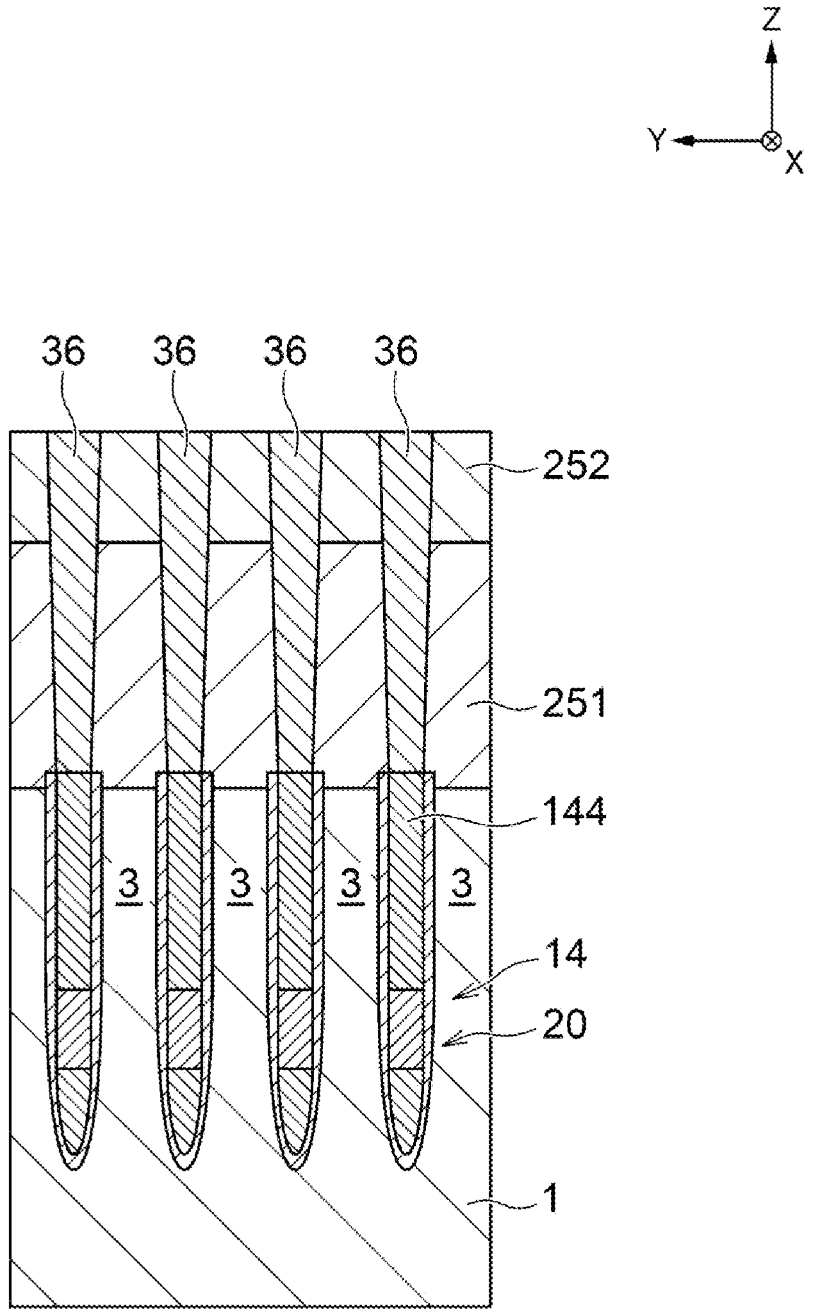

Next, as shown in FIGS. 10A, 10B and 10C, a conductive material film is formed on the surfaces of the memory cell array region M, the dummy memory cell array regions N1 and N2, and the peripheral regions O1 and O2, inside the word line contact holes 204, and on the first capacitive contact electrodes 251 of the memory cell array region M. Before the conductive material film is formed, a pretreatment using, for example, diluted hydrogen fluoride (DHF) is carried out. This pretreatment removes native oxide formed on the surfaces of the first capacitive contact electrodes 251.

Next, etch back is performed on this conductive material film. The film formation of the conductive material is performed, for example, by using the CVD technique. For example, tungsten (W) is used as the conductive material. For example, anisotropic dry etching can be used as the etch back.

The etch back is performed to the extent that the upper surface of the conductive material is flush with the upper surfaces of the insulating walls 36 and the sixth insulating film 10. The upper surfaces of the insulating walls 36 and the sixth insulating film 10 are exposed by the etch back. The conductive material remaining in the word line contact holes 204 will serve as the word line contact electrodes 201.

In the memory cell array region M, the conductive material is likewise etched back to the extent that the upper surface of the conductive material is flush with the upper surfaces of the insulating walls 36. The conductive material remaining in trenches at the upper portions of the first capacitive contact electrodes 251 will serve as the second capacitive contact electrodes 252. In the memory cell array region M, for example, cobalt silicide (CoSi) may be formed between the first capacitive contact electrode 251 and the second capacitive contact electrode 252. Before the formation of cobalt silicide, a pretreatment using diluted hydrogen fluoride is performed. The first capacitive contact electrodes 251, the second capacitive contact electrodes 252, and the pad electrodes 253 will serve as electrodes for connecting the storage capacitors 24 and the active regions 3 as described later. The insulating walls 36 have a function of insulating and separating the adjacent first and second capacitive contact electrodes 251 and 252 from each other.

As shown in FIG. 10A, the peripheral bit line contact electrodes 181 and the dummy bit line contact electrodes 191 are formed on the bit lines 18 and the dummy bit lines 19. The peripheral bit line contact electrodes 181 and the dummy bit line contact electrodes 191 are formed by forming contact holes using a known lithography technique and a known anisotropic dry etching technique, and then filling the contact holes with a conductive material.

Next, as shown in FIGS. 11A, 11B and 11C, word line extraction electrodes 202 to be connected on the word line contact electrodes 201 are formed in the X-direction peripheral region O1. Further, the dummy bit line contact electrodes 191 and the dummy bit line extraction electrodes 192 to be connected to the bit lines 18 and the dummy bit lines 19 respectively are formed in the Y-direction peripheral region O2. The word line extraction electrodes 202, the bit line extraction electrodes 182, and the dummy bit line extraction electrode 192 include a conductive material, for example, tungsten (W). The word line extraction electrodes 202, the bit line extraction electrodes 182, and the dummy bit line extraction electrode 192 are formed by forming a film of a conductive material over the entire surfaces and then patterning the conductive material using a known lithography technique and a known anisotropic dry etching technique.

Further, in the memory cell array region M, the pad electrodes 253 to be connected to the second capacitive contact electrodes 252 are formed on the second capacitive contact electrodes 252. The pad electrodes 253 include a conductive material, for example, tungsten (W). The pad electrodes 253 are formed by patterning a conductive material using a known lithography technique and a known anisotropic dry etching technique. Further, the pad electrodes 253 may be formed by using a known double patterning technique or a quad patterning technique. The conductive material is formed, for example, by using the CVD technique. During the formation of the pad electrodes 253, only the memory cell array region M can be processed, for example, by forming appropriate masks on the peripheral regions O1 and O2 and the dummy memory cell array regions N1 and N2.

Next, as shown in FIGS. 3A, 3B, 3C and 3D, the eighth insulating film 12 is formed so as to cover the upper surfaces of the memory cell array region M, the dummy memory cell array regions N1 and N2, and the peripheral regions O1 and O2. The eighth insulating film 12 contains, for example, silicon dioxide ($SiO_2$). The eighth insulating film 12 is formed, for example, by the CVD technique. In the memory cell array region M, the storage capacitors 24 are formed. The storage capacitor 24 includes a lower electrode 241, a capacitive insulating film 242, and an upper electrode 243.

The storage capacitors 24 are formed by the following steps. The eighth insulating film 12 is formed in a region comprising the memory cell array region M. The eighth insulating film 12 contains silicon dioxide, and is formed, for example, by the CVD technique. Next, a hall hole reaching an upper part of each pad electrode 253 is formed. The hall holes are formed by known lithography technique and anisotropic dry etching.

Next, the lower electrodes 241 are filled in the hall holes. Next, the eighth insulating film 12 surrounding the lower electrodes 241 is etched and removed to the extent that it has a height at which the pad electrodes 253 have not yet been exposed. The etching of the eighth insulating film 12 is performed, for example, by using isotropic dry etching or wet etching using buffered hydrofluoric acid (BHF). The lower electrode 241 includes a conductive material, for example titanium nitride (TiN). The lower electrode 241 is formed, for example, by the CVD technique. The upper electrodes 243 are connected to a potential (not shown) and function as plate electrodes of the storage capacitors 24.

Next, the capacitive insulating film 242 is formed so as to cover the lower electrodes 241. The capacitive insulating film 242 contains, for example, hafnium oxide ($HfO_2$). The capacitive insulating film 242 is formed, for example, by using the CVD technique. Next, the upper electrodes 243 are formed so as to integrally cover the plurality of lower electrodes 241 covered with the capacitive insulating film 242. The upper electrodes 243 include a conductive material, for example, titanium nitride (TiN). The upper electrodes 243 are formed, for example, by the CVD technique.

The semiconductor device according to the embodiment is formed by the above steps.

As described above, in the semiconductor device according to the embodiment, the insulating walls 36 are formed just above the word lines 20 not only in the memory cell array region M, but also in the X-direction peripheral region O1. When the word line contact electrodes 201 to be connected to the word lines 20 are formed in the X-direction peripheral region O1, the word line contact holes 204 are formed under a condition that the etching rate of the insulating walls 36 is high, whereby it is suppressed that the word line contact holes 204 are displaced from the word lines 20. As a result, it is possible to suppress occurrence of a short circuit between the adjacent word lines 20. As a result, the manufacturing yield of the semiconductor device can be enhanced, and the reliability of the semiconductor device can be enhanced.

As described above, the semiconductor device according to the embodiment has been described by exemplifying DRAM. However, this is an example, and there is no intention of limiting to DRAM. Memory devices other than DRAM, for example, a static random access memory (SRAM), a flash memory, an erasable programmable read only memory (EPROM), a magnetoresistive random access memory (MRAM), a phase-change memory and the like may be applied as the semiconductor device.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

The invention claimed is:

1. An apparatus comprising:

a plurality of memory cells in a memory cell array region;

a plurality of word lines extending across the memory cell array region and a peripheral region in which no memory cell is arranged, the plurality of word lines comprising a plurality of even-numbered word lines and a plurality of odd-numbered word lines, the odd-numbered word lines each disposed between a respective pair of the even-numbered word lines;

a plurality of contact plugs, each contact plug of the plurality of contact plugs disposed on a respective even-numbered word line of the plurality of even-numbered word lines in the peripheral region, each even-numbered word line having disposed thereon a respective one of the plurality of contact plugs, wherein an upper surface of each even-numbered word line is below a lowest surface of the respective one of the plurality of contact plugs;

a plurality of insulating walls, each insulating wall of the plurality of insulating walls disposed above a respective odd-numbered word line of the plurality of odd-numbered word lines in the peripheral region, each odd-numbered word line having disposed above it a respective one of the plurality of insulating walls; and an insulating film over the plurality of word lines in the peripheral region, the insulating film surrounding the plurality of contact plugs and the plurality of insulating walls in the peripheral region.

2. The apparatus of claim 1, wherein the insulating film comprises a different insulating material than each of the plurality of insulating walls.

3. The apparatus of claim 2, wherein the insulating film comprises silicon dioxide and each of the plurality of insulating walls comprises silicon nitride.

4. The apparatus of claim 1, further comprising a plurality of additional insulating walls on the even-numbered word lines of the plurality of word lines in the peripheral region, respectively;

wherein each of the plurality of additional insulating walls is divided into two portions by an associated one of the plurality of contact plugs.

5. The apparatus of claim 4, wherein each of the plurality of insulating walls and each of the plurality of additional insulating walls extend from the memory cell array region to the peripheral region.

6. The apparatus of claim 1, wherein each of the plurality of the word lines has a first electrode portion and a second electrode portion on the first electrode portion in the memory cell array region, and wherein each of the plurality of the word lines in the peripheral region has the first electrode portion.

7. The apparatus of claim 6, wherein the first electrode portion comprises titanium nitride, and the second electrode portion comprises polysilicon doped with impurities.

8. An apparatus comprising:

a plurality of memory cells in a memory cell array region;

a plurality of word lines extending across a first peripheral region, the memory cell array region, and a second peripheral region, wherein the first and second peripheral regions have no memory cell, the plurality of word lines comprising even-numbered word lines and odd-numbered word lines, the odd-numbered word lines each disposed between a respective pair of the even-numbered word lines;

a plurality of first contact plugs each disposed on a respective even-numbered word line of the even-numbered word lines in the first peripheral region, each even-numbered word line having disposed thereon a respective one of the plurality of first contact plugs, wherein an upper surface of each even-numbered word line is below a lowest surface of the respective one of the plurality of first contact plugs;

a plurality of second contact plugs each disposed on a respective odd-numbered word line of the odd-numbered word lines in the second peripheral region, each odd-numbered word line having disposed thereon a respective one of the plurality of second contact plugs, wherein an upper surface of each odd-numbered word line is below a lowest surface of the respective one of the plurality of second contact plugs;

a plurality of first insulating walls each disposed on a respective odd-numbered word line of the odd-numbered word lines in the first peripheral region, each odd-numbered word line having disposed thereon a respective one of the plurality of first insulating walls;

a plurality of second insulating walls each disposed on a respective even-numbered word line of the even-numbered word lines in the second peripheral region each even-numbered word line having disposed thereon a respective one of the plurality of second insulating walls; and an insulating film over the plurality of word lines in the first and second peripheral regions, the insulating film surrounding the plurality of first contact plugs, the plurality of second contact plugs, the plurality of first insulating walls and the plurality of second insulating walls in the first and second peripheral regions.

9. The apparatus of claim 8, wherein the insulating film comprises a different insulating material than each of the plurality of first insulating walls and the plurality of second insulating walls.

10. The apparatus of claim 9, wherein the insulating film comprises silicon dioxide and each of the plurality of first insulating walls and the plurality of second insulating walls comprises silicon nitride.

11. The apparatus of claim 8, further comprising:

a plurality of third insulating walls each disposed on a respective even-numbered word line of the even-numbered word lines in the first peripheral region, respectively; and a plurality of fourth insulating walls each disposed on a respective odd-numbered word line of the odd-numbered word lines in the second peripheral region, respectively;

wherein each of the plurality of third insulating walls is divided into two portions by an associated one of the plurality of first contact plugs, respectively; and wherein each of the plurality of fourth insulating walls is divided into two portions by an associated one of the plurality of second contact plugs, respectively.

12. The apparatus of claim 8, wherein each of the first insulating walls and each of the second insulating walls extend across the first peripheral region, the memory cell array region and the second peripheral region.

13. The apparatus of claim 8, wherein each of the plurality of the word lines has a first electrode portion and a second electrode portion on the first electrode portion in the memory cell array region, and wherein each of the plurality of the word lines in the first and second peripheral regions has the first electrode portion.

14. The apparatus of claim 13, wherein the first electrode portion comprises titanium nitride, and the second electrode portion comprises polysilicon doped with impurities.

* * * * *